(12) United States Patent
Manger et al.

(10) Patent No.: US 11,274,914 B2
(45) Date of Patent: Mar. 15, 2022

(54) MEASURING ASSEMBLY FOR THE FREQUENCY-BASED DETERMINATION OF THE POSITION OF A COMPONENT

(71) Applicant: Carl Zeiss SMT GmbH, Oberkochen (DE)

(72) Inventors: Matthias Manger, Aalen (DE); Andreas Koeniger, Aalen (DE); Alexander Vogler, Aalen (DE)

(73) Assignee: CARL ZEISS SMT GMBH, Oberkochen (DE)

( * ) Notice: Subject to any disclaimer, the term of this patent is extended or adjusted under 35 U.S.C. 154(b) by 0 days.

(21) Appl. No.: 17/102,503

(22) Filed: Nov. 24, 2020

(65) Prior Publication Data

US 2021/0080244 A1   Mar. 18, 2021

Related U.S. Application Data

(63) Continuation of application No. PCT/EP2019/061038, filed on Apr. 30, 2019.

(30) Foreign Application Priority Data

May 24, 2018  (DE) ..................... 10 2018 208 147.6

(51) Int. Cl.
   *G01B 9/02* (2006.01)
   *G03F 7/20* (2006.01)
   (Continued)

(52) U.S. Cl.
   CPC ..... *G01B 9/02003* (2013.01); *G01B 9/02008* (2013.01); *G01B 9/02018* (2013.01);
   (Continued)

(58) Field of Classification Search
   CPC ............ G01B 9/02003; G01B 9/02007; G01B 9/02018; G01B 2290/25
   See application file for complete search history.

(56) References Cited

U.S. PATENT DOCUMENTS 5,555,089 A   9/1996  Dunn et al.
5,781,295 A   7/1998  Fuchs et al.
(Continued)

FOREIGN PATENT DOCUMENTS

DE   19528676 A1   2/1997
DE   19548647 C2   1/2003
(Continued)

OTHER PUBLICATIONS

Lezius et al., "High Accuracy Long Distance Measurement with Frequency Combs", Menlo Systems GmbH, Observation of the System Earth from Space: Geotechnologien, Science Report 17, (Oct. 2010), 8 pages.

(Continued)

*Primary Examiner* — Michael A Lyons
(74) *Attorney, Agent, or Firm* — Edell, Shapiro & Finnan LLC

(57) ABSTRACT

A measuring assembly for the frequency-based determination of the position of a component, in particular in an optical system for microlithography, includes at least one optical resonator, which has a stationary first resonator mirror, a movable measurement target assigned to the component, and a stationary second resonator mirror. The second resonator mirror is formed by an inverting mirror (130, 330, 430, 530), which reflects back on itself a measurement beam coming from the measurement target.

22 Claims, 20 Drawing Sheets

(51) Int. Cl.
*G01B 9/02003* (2022.01)
*G01B 9/02001* (2022.01)
*G01B 9/02018* (2022.01)
*G01B 9/02017* (2022.01)

(52) U.S. Cl.
CPC ....... *G01B 9/02019* (2013.01); *G03F 7/7085* (2013.01); *G03F 7/70775* (2013.01)

(56) References Cited

U.S. PATENT DOCUMENTS

| | | | |
|---|---|---|---|
| 6,785,305 | B1 | 8/2004 | Gabbert et al. |
| 6,864,988 | B2 | 3/2005 | Hof et al. |
| 6,897,962 | B2* | 5/2005 | Johnstone .......... G01B 9/02007 356/487 |
| 7,022,978 | B2 | 4/2006 | Clark et al. |
| 9,759,550 | B2 | 9/2017 | Wolf et al. |
| 2010/0259760 | A1 | 10/2010 | Karrai |
| 2011/0157598 | A1* | 6/2011 | Wang ................. G01B 9/02061 356/487 |
| 2011/0211199 | A1 | 9/2011 | Karrai et al. |
| 2014/0355631 | A1* | 12/2014 | Mayzlin .................. G02F 1/116 372/28 |
| 2015/0019160 | A1* | 1/2015 | Thurner ............. G01B 9/02007 702/150 |
| 2015/0198437 | A1 | 7/2015 | Wolf et al. |
| 2018/0164089 | A1* | 6/2018 | Schonleber ........ G01B 9/02063 |

FOREIGN PATENT DOCUMENTS

| | | |
|---|---|---|
| DE | 102012212663 A1 | 1/2014 |
| DE | 102016113049 A1 | 1/2018 |
| DE | 102019201146 A1 | 3/2019 |
| EP | 2045572 A1 | 4/2009 |
| EP | 2363685 A1 | 9/2011 |
| JP | 2016-502665 A | 1/2016 |
| KR | 10-2006-0090936 A | 8/2006 |
| KR | 10-2014-0050789 A | 4/2014 |
| WO | 2014081773 A1 | 5/2014 |

OTHER PUBLICATIONS

F. Riehle, Frequency Standards Basics & Applications, Section 4.3 Optical Resonators, and Section 4.4 Stability of Resonators, Wiley, 2004, 19 pages.
J. Reichert, "Precise optical frequency measurements with mode-coupled lasers," Dissertation, German Application No. 10 2018 208 147, Apr. 2000, 9 pages.
German Office Action with English translation, Application No. DE 10 2018 208 147.6, dated May 22, 2019, 13 pages.
International Preliminary Report on Patentability, PCT/EP2019/061038, dated Nov. 24, 2020, 7 pages.
International Search Report, PCT/EP2019/061038, dated Aug. 1, 2019, 3 pages.
Bitou et al., "Accurate wide-range displacement measurement using tunable diode laser and optical frequency comb generator", Optics Express, OSA Publishing, vol. 14, No. 2, Jan. 23, 2006, 11 pages.
JP Office Action with English translation, Application No. JP2020-564422, dated Jan. 6, 2022, 7 pages.
European Office Action with English Translation, Application No. 19724359.5, dated Jan. 25, 2022, 13 pages.

* cited by examiner

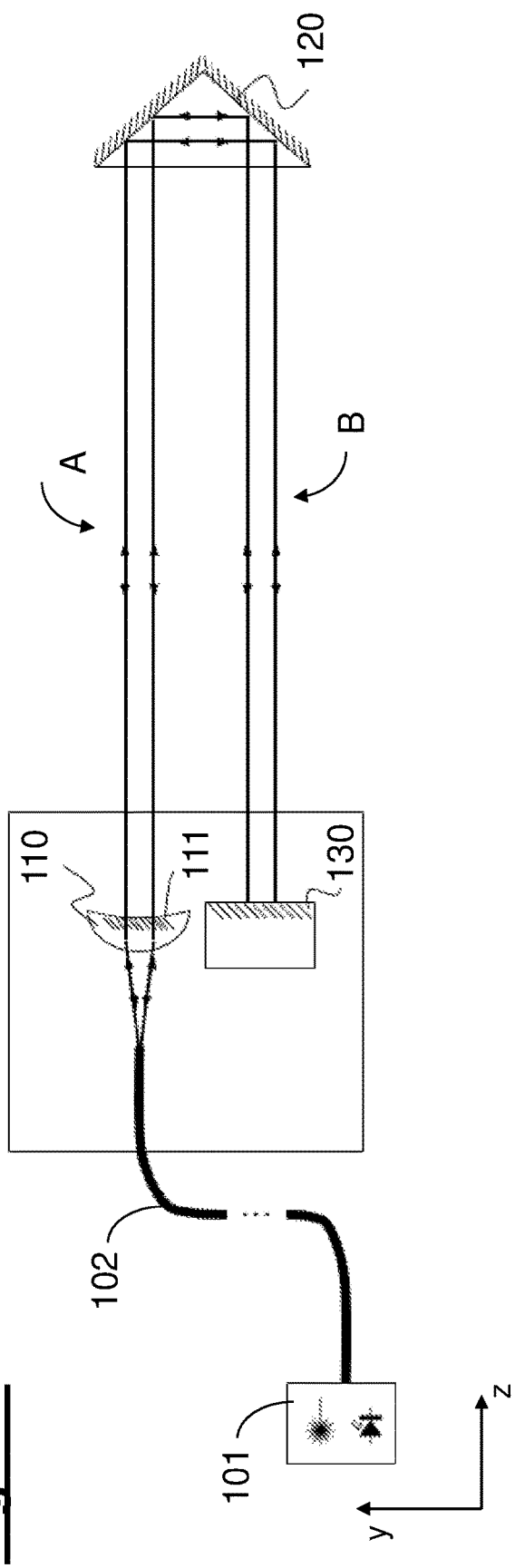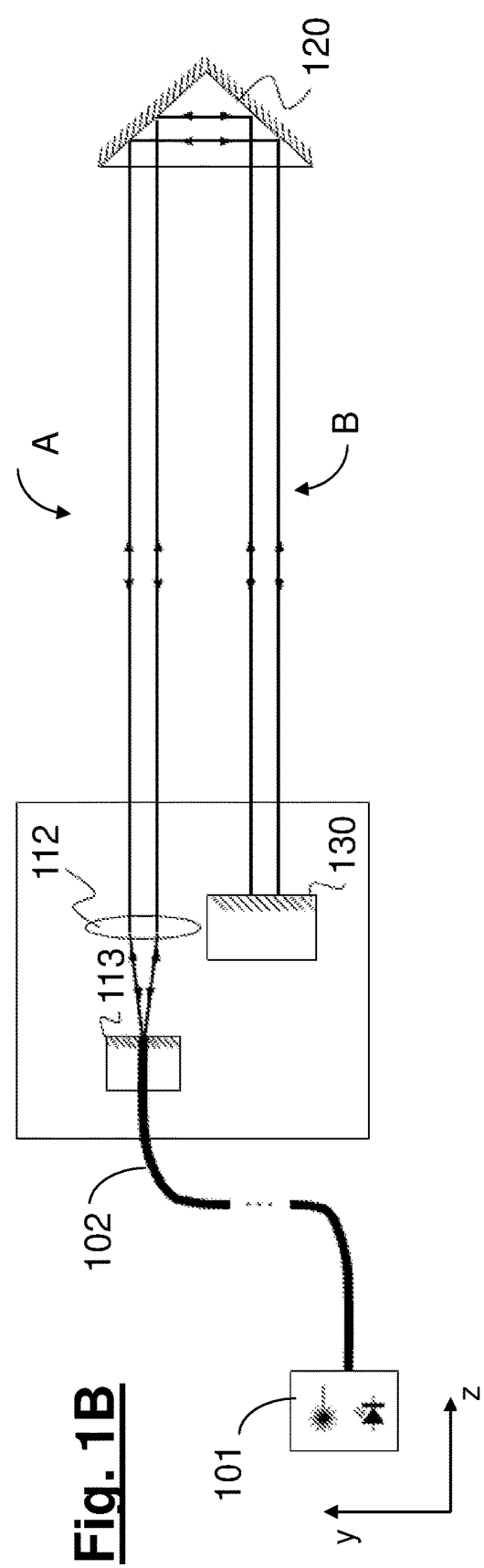

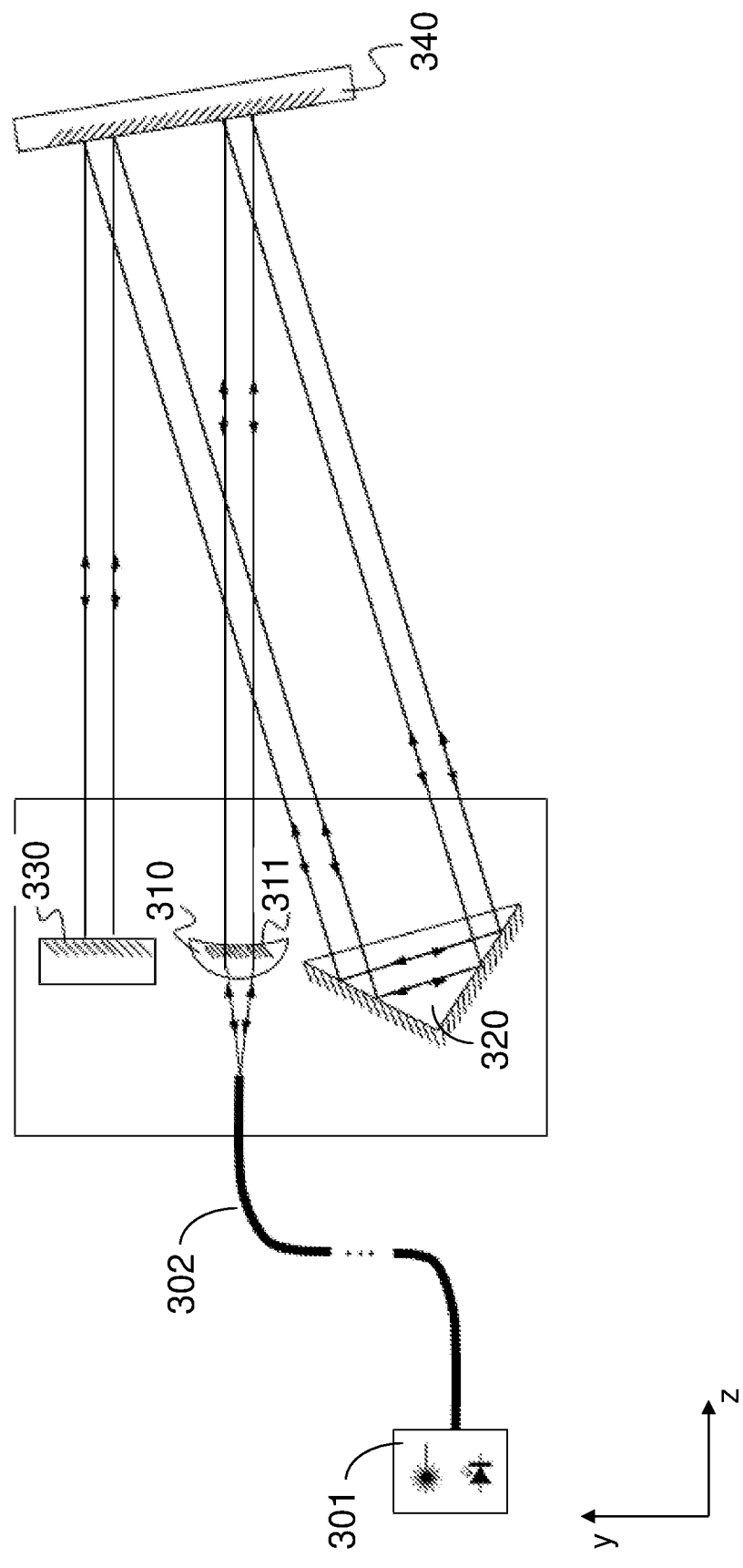

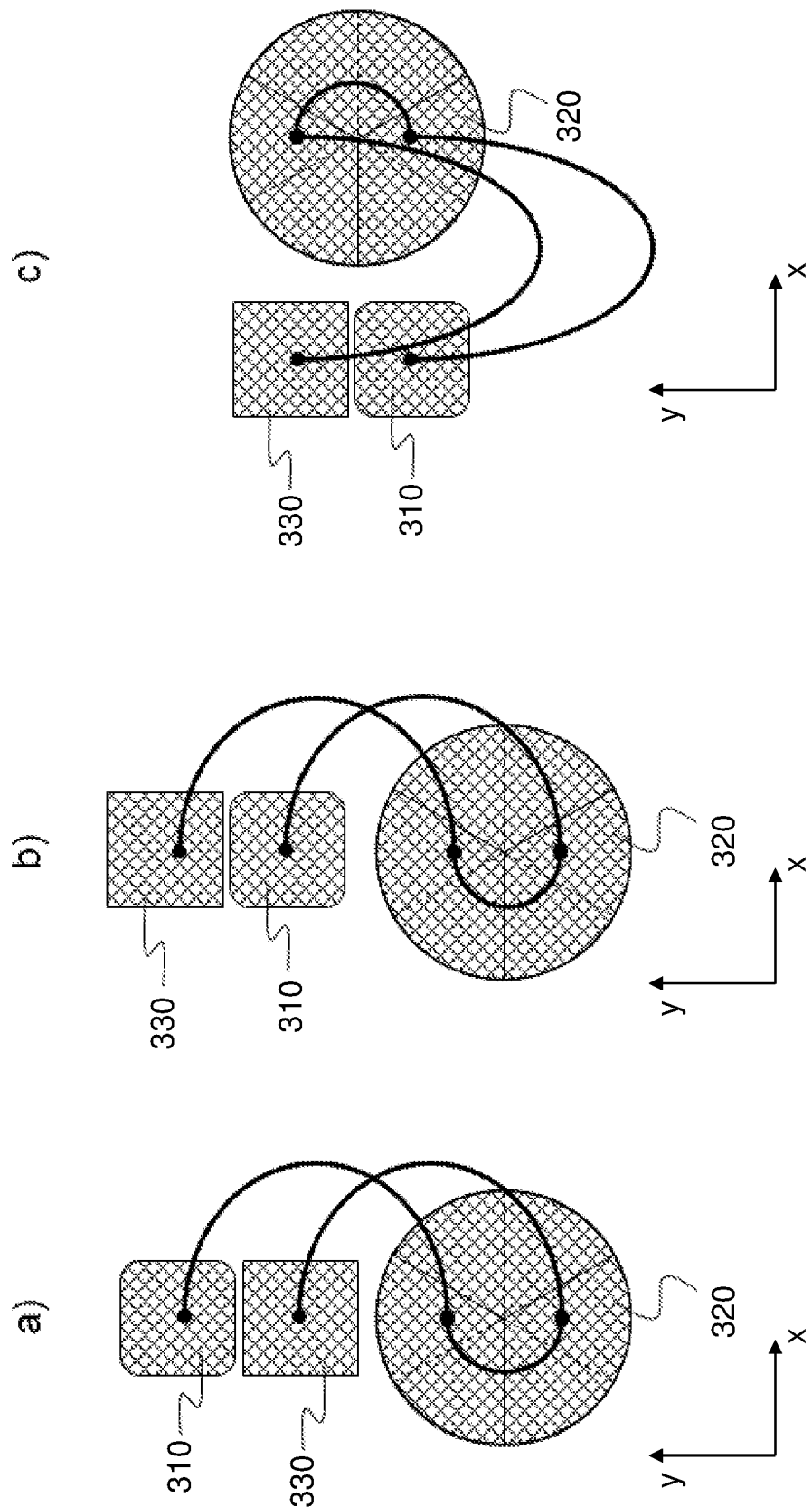

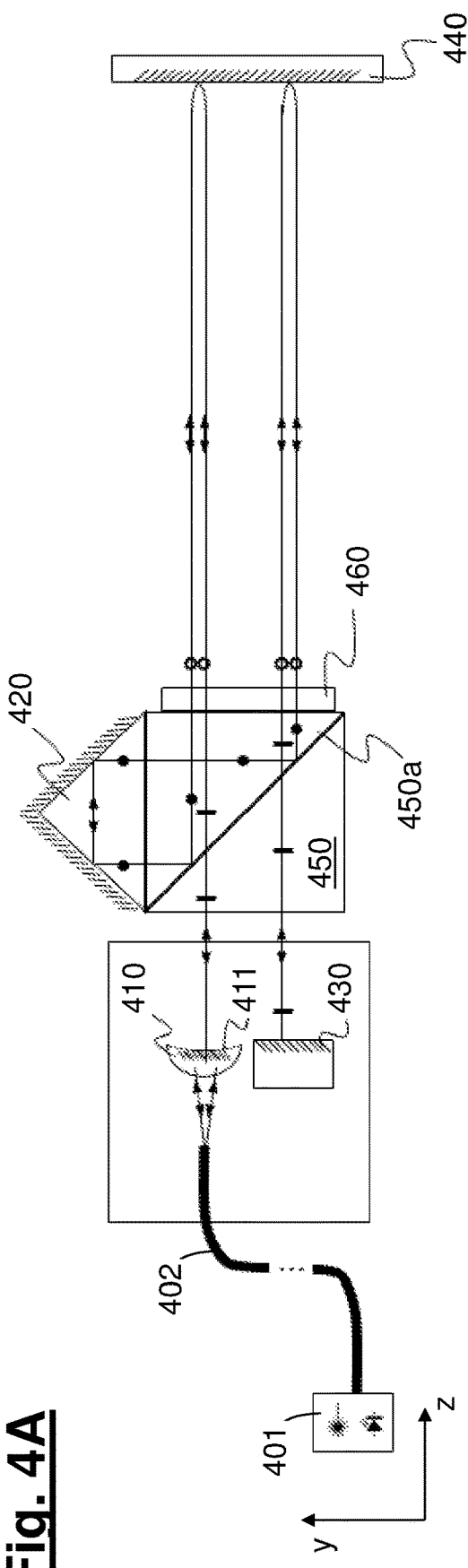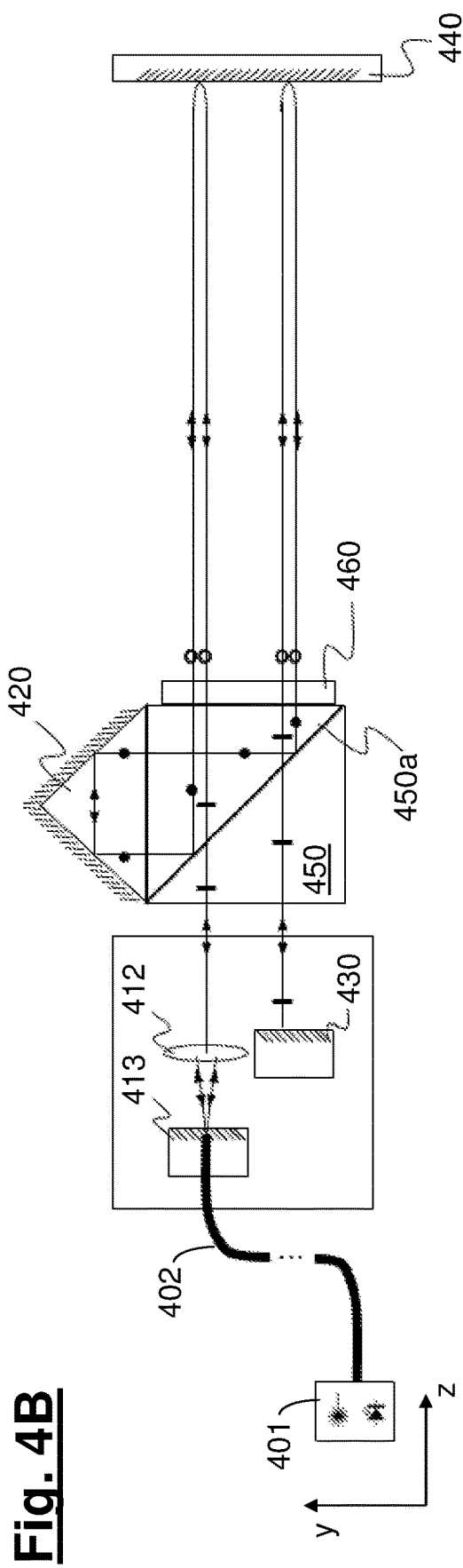

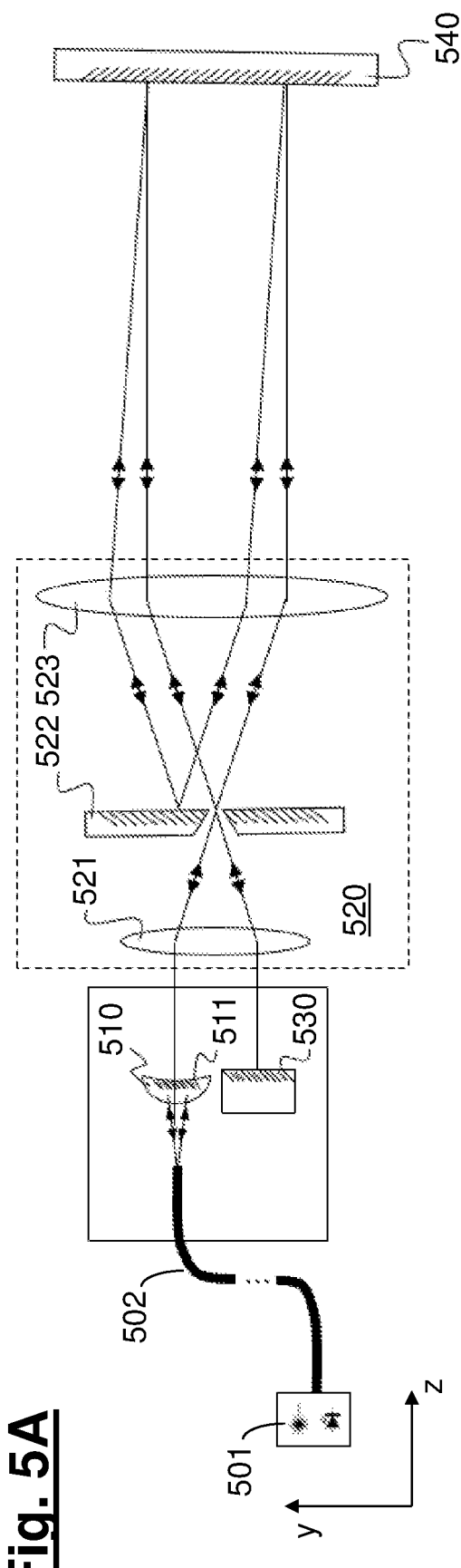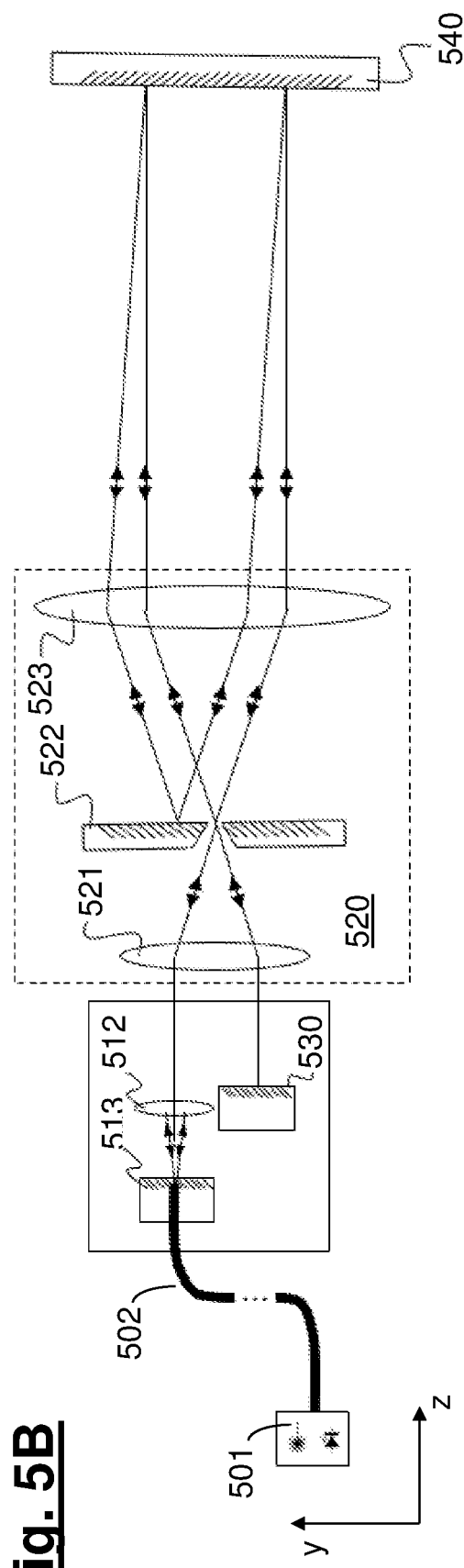

MEASURING ASSEMBLY FOR THE FREQUENCY-BASED DETERMINATION OF THE POSITION OF A COMPONENT

CROSS REFERENCE TO RELATED APPLICATIONS

This is a Continuation of International Application PCT/EP2019/061038, which has an international filing date of Apr. 30, 2019, and the disclosure of which is incorporated in its entirety into the present Continuation by reference. This Continuation also claims foreign priority under 35 U.S.C. § 119(a)-(d) to and also incorporates by reference, in its entirety, German Patent Application DE 10 2018 208147.6 filed on May 24, 2018.

FIELD OF THE INVENTION

The invention relates to a measuring assembly for the frequency-based determination of the position of a component, in particular in an optical system for microlithography.

BACKGROUND

Microlithography is used for production of microstructured components, such as for example integrated circuits or liquid crystal displays (LCDs). The microlithography process is conducted in a so-called projection exposure apparatus, which comprises an illumination device and a projection lens. The image of a mask (=reticle) illuminated by this illumination device is projected by the projection lens onto a substrate (e.g. a silicon wafer) coated with a light-sensitive layer (photoresist) and arranged in the image plane of the projection lens, in order to transfer the mask structure to the light-sensitive coating of the substrate.

In projection exposure apparatuses designed for the extreme ultraviolet (EUV) range, i.e. at wavelengths of less than 15 nm (e.g. approximately 13 nm or approximately 7 nm), owing to the lack of availability of suitable light-transmissive refractive materials, mirrors are used as optical components for the imaging process.

During operation of such projection lenses designed for EUV, during which mask and wafer are usually moved relative to one another in a scanning process, the positions of the mirrors, which are movable in part in all six degrees of freedom, have to be set and maintained with high accuracy both with respect to one another and also with respect to mask and/or wafer in order to avoid or at least reduce aberrations and accompanying impairments of the imaging result. During this position determination, accuracies of the length measurement in the picometer (pm) range may be demanded e.g. over a path length of one meter.

Diverse approaches for measuring the position of the individual lens mirrors and also of the wafer or the wafer stage and the reticle plane are known in the prior art. Besides interferometric measuring assemblies, frequency-based position measurement using an optical resonator is also known.

In a conventional arrangement as known from DE 10 2012 212 663 A1 and illustrated in FIG. 12, for example, a resonator 152 in the form of a Fabry-Perot resonator comprises two resonator mirrors 154 and 155, of which the first resonator mirror 154 is secured to a reference element 140 in the form of a measurement frame fixedly connected to the housing of the projection lens of the projection exposure apparatus and the second resonator mirror 155 (as "measurement target") is secured to an EUV mirror M to be measured with regard to the position thereof. The actual distance measurement device comprises a radiation source 156, which is tunable with respect to its optical frequency and which generates input coupling radiation 158 that passes through a beam splitter 162 and is coupled into the optical resonator 152. In that case, the radiation source 156 is controlled by a coupling device 160 in such a way that the optical frequency of the radiation source 156 is tuned to the resonant frequency of the optical resonator 152 and is thus coupled to said resonant frequency. Input coupling radiation 158 coupled out via a beam splitter 162 is analyzed with an optical frequency measuring device 164, which can comprise e.g. a frequency comb generator 132 for highly accurately determining the absolute frequency. If the position of the EUV mirror M changes in the x-direction, then together with the distance between the resonator mirrors 154 and 155 the resonant frequency of the optical resonator 152 also changes and hence—owing to the coupling of the frequency of the tunable radiation source 156 to the resonant frequency of the resonator 152—the optical frequency of the input coupling radiation 158 changes as well, which is in turn registered directly by the frequency measuring device 164.

The functionality of an optical resonator during the distance measurement e.g. in accordance with FIG. 12 requires, firstly, that the measurement beam within the optical resonator can accomplish the highest possible number of circulations within the resonator (without said measurement beam leaving the cavity formed by the resonator), in order that eigenmodes can form in the resonator. Moreover, the external radiation field present at the input of the resonator path (="input coupling field") must be capable of being coupled to the mode field of the optical resonator (="resonator field"). In this case, the coupling efficiency that is characteristic of said coupling is defined by the overlap integral between input coupling field and resonator field, such that in order to achieve a high coupling efficiency, input coupling field and resonator field must correspond as well as possible in all relevant parameters.

In practice, then, with the use of an optical resonator for distance measurement during the measurement of the position of a component or of a mirror problems can result from the fact that movements of the measurement target arranged at the mirror (which measurement target can be configured e.g. in the form of a retroreflector or a plane mirror) can occur not only along the actual measurement direction, but also in other degrees of freedom from among the total of six degrees of freedom. Such (parasitic) movements that do not take place along the measurement direction, e.g. intended or unintended tiltings or lateral displacements of the measurement target, can have the effect that a "drift" of the chief ray, on which the modes of the resonators are "threaded" as it were, in terms of position and angle takes place with the consequence that sufficient coupling of the resonator fields to the input coupling field is no long provided.

In view of the stringent requirements to be made here of the beam direction deviation (which requirements may demand e.g. that angular deviations for the beam vector of the chief ray are less than 0.1), ensuring that tiltings or lateral displacements of the measurement target do not take effect during the frequency-based position determination constitutes a demanding challenge.

SUMMARY

It is an object of the present invention to provide a measuring assembly for the frequency-based determination of the position of a component, in particular in an optical system for microlithography, which enables a highly accurate position determination while avoiding the problems described above.

This object is achieved, according to one formulation of the invention, by a measuring assembly for the frequency-based determination of the position of a component, in particular in an optical system for microlithography, which comprises:

at least one optical resonator, wherein said resonator comprises a stationary first resonator mirror, a movable measurement target assigned to the component, and a stationary second resonator mirror, wherein the second resonator mirror is formed by an inverting mirror, which reflects back on itself a measurement beam coming from the measurement target.

In accordance with one embodiment, the resonator further comprises a retroreflector, which inverts the measurement beam in a parallel-offset manner identically in its direction. In this case, said retroreflector can be configured as a cube corner retroreflector (hollow or glass body retroreflector) or as a cat's eye retroreflector (e.g. with a Fourier lens element with a mirror arranged in its focal plane).

The invention makes use of the concept, in particular, of repeatedly passing through the path to be traversed by the measurement beam in an optical resonator with the positioning of an inverting mirror. Using the principle of the invertibility of the light path, it is ensured in this way that lateral displacements or tiltings on the part of a component to be measured and/or the measurement target assigned to said component which do not act solely in the measurement direction do not take effect during the frequency-based position determination or continue to have no effects on the measurement result.

In other words, what is achieved by the use according to the invention of an inverting mirror in the measurement arm is that regardless of lateral displacements or tiltings of the measurement target assigned to the component to be measured, the measurement beam arriving at said inverting mirror is reflected back on itself. Said measurement beam thus returns on the identical path via the measurement target with the consequence that variations in the degrees of freedom which do not act along the direction of the measurement arm (measurement axis) are completely eliminated in terms of their effects on the measurement.

Lateral displacements or tiltings of the measurement target assigned to the component to be measured transversely with respect to the measurement direction (which are not directly detected by the distance measurement and in this respect may also be referred to as "parasitic movements") thus no longer play a part in the result during the distance measurement according to the invention. Consequently, the measuring assembly according to the invention has an increased insensitivity with regard to said parasitic movements with the consequence that a highly accurate position measurement can be realized in scenarios in which stable control of the position of said measurement target is not possible or the outlay associated therewith is intended to be avoided.

In accordance with one embodiment, the measurement target is formed by a retroreflector.

In accordance with a further embodiment, the measurement target is formed by a plane mirror.

In accordance with one embodiment, the measuring assembly comprises a polarization-optical beam splitter. In this case, in particular, as described in even greater detail below, normal incidence on a measurement target embodied as a plane mirror can be achieved by the beam path being folded directly onto the optical axis with the use of the polarization-optical beam splitter.

In accordance with one embodiment, a measurement beam coming from the polarization-optical beam splitter is incident perpendicularly on the measurement target.

In accordance with one embodiment, the measuring assembly comprises an optical group comprising two lens elements in a Kepler arrangement.

In accordance with one embodiment, the optical group comprises a mirror having an opening in a common focal plane of said two lens elements, said mirror reflecting back the beam path returning from the measurement target.

In accordance with one embodiment, the retroreflector is configured in a polarization-maintaining fashion.

In accordance with one embodiment, the first resonator mirror has a curvature such that a light field present in the resonator is stably confined.

In accordance with one embodiment, the first resonator mirror is configured as a cat's eye mirror. In this case, preferably, in order to produce a wavefront curvature required for the field confinement in the resonator, said mirror is arranged in a defocused manner in a defined way relative to the focal planes of a lens element.

In accordance with one embodiment, the measuring assembly comprises at least one tunable laser stabilized to a resonator mode of the optical resonator.

In accordance with one embodiment, the measuring assembly comprises a control loop configured for stabilizing the tunable laser according to the Pound-Drever-Hall method.

In accordance with one embodiment, the measuring assembly comprises at least one femtosecond laser for determining the frequency of the laser radiation of the at least one tunable laser.

In accordance with one embodiment, the measuring assembly furthermore comprises a frequency standard, in particular a gas cell.

In accordance with one embodiment, the measuring assembly comprises, for realizing an absolute length measurement, two tunable lasers, which are able to be stabilized to different resonator modes with a known frequency spacing of the optical resonator. In this case, a beat frequency analyzer unit can be assigned to each of said two tunable lasers.

The configuration with two tunable lasers, which are able to be stabilized to different resonator modes with a known frequency spacing of the optical resonator, makes it possible, as explained in even greater detail below, to take account of an otherwise existing ambiguity problem that occurs in the spectrum—representing a periodic diamond pattern—of the beat frequencies e.g. between a tunable laser stabilized to a resonator mode and a femtosecond laser with regard to the counting direction of the passages through cell boundaries in the diamond pattern. Specifically, in the abovementioned configuration according to the invention, the laser frequencies of the two tunable lasers have two interlaced grids of beat frequencies, on the basis of which, as will also be described below, said counting direction ambiguity is able to be eliminated.

In accordance with one embodiment, the measuring assembly comprises an acousto-optical modulator for realizing a frequency shift in the case of a partial beam branched off from the laser beam generated by the tunable laser.

In accordance with one embodiment, six optical resonators for frequency-based length measurement are assigned to the component for position determination in six degrees of freedom.

In accordance with one embodiment, the component is a mirror.

In accordance with one embodiment, the optical system is a microlithographic projection exposure apparatus.

Further configurations of the invention can be gathered from the description and the dependent claims.

The invention is explained in greater detail below on the basis of exemplary embodiments illustrated in the accompanying figures.

BRIEF DESCRIPTION OF THE DRAWINGS

In the figures:

FIG. 1A shows a schematic illustration for explaining the arrangement and the functioning of a measuring assembly in an exemplary embodiment of the invention;

FIG. 1B shows a schematic illustration for explaining the arrangement and the functioning of a measuring assembly in a further exemplary embodiment of the invention;

FIG. 3A shows a schematic illustration for explaining a further embodiment of a measuring assembly according to the invention;

FIG. 3C shows on the basis of the embodiments from FIGS. 3A-3B some possible configurations that differ in their geometric arrangement;

FIG. 4A shows a schematic illustration for explaining a further embodiment of a measuring assembly according to the invention;

FIG. 4B shows a schematic illustration for explaining a further embodiment of a measuring assembly according to the invention;

FIG. 5A shows a schematic illustration for explaining a further embodiment of a measuring assembly according to the invention;

FIG. 5B shows a schematic illustration for explaining a further embodiment of a measuring assembly according to the invention;

DETAILED DESCRIPTION

Figure 1C:
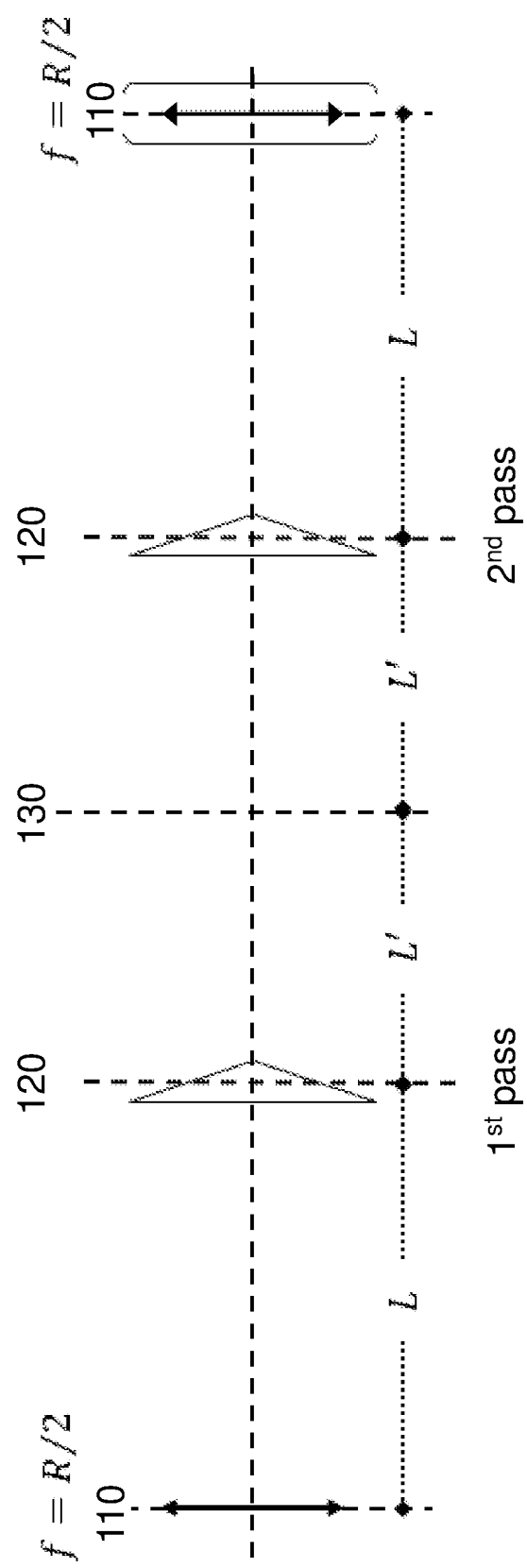
FIG. 1C shows a derived equivalent circuit diagram concerning the embodiments from FIGS. 1A-1B.

FIGS. 1A-1B show schematic illustrations for explaining the arrangement and the functioning of a measuring assembly in exemplary embodiments of the invention.

In accordance with FIG. 1A, after entering the resonator via a unit 101 (the arrangement and functioning of which will be described in even greater detail with reference to FIGS. 6-11) and an optical fiber 102 through a stationary curved resonator mirror 110 after passing through a free-space path A, a measurement beam is incident on a retroreflector 120 (as measurement target) in an off-axis manner and is reflected back in a parallel-offset manner. After passing through a free-space path B, the measurement beam is reflected back on itself without a beam offset by an inverting mirror 130 located perpendicular to the beam propagation direction. After once again passing through the free-space paths B and A including the retroreflector 120, the measurement beam is incident again on the stationary curved resonator mirror 110, thereby closing the circulation.

Since, after reflection at the inverting mirror (="recirculation mirror") 130 located perpendicular to the beam propagation direction, the measurement beam returns back on itself identically, as a result using the principle of the "invertibility of the light path" a beam offset accompanying a transverse displacement of the retroreflector 120 forming the measurement target is compensated to zero.

The embodiment illustrated in FIG. 1B differs from that from FIG. 1A merely in that a stationary "cat's eye optical unit" composed of a Fourier lens element 112 with a mirror 113 arranged in its focal plane is used instead of the stationary curved resonator mirror 110. In order to produce the wavefront curvature required for the confinement in the resonator, said mirror 113 is arranged in a defocused manner in a defined way relative to the focal plane of the lens element.

To afford an understanding of the further explanations, the extended formalism of paraxial matrix optics is briefly introduced below, and this formalism will then be used to set out principles of the optics of resonators. The extension of the formalism comprises taking account of beam offsets and beam deviations such as occur unavoidably in measuring resonators for position determination. The general transfer matrix of an optical system or of a subsystem consisting of spherically curved and/or plane elements (mirrors and plates) reads as follows in this formalism $$M = \begin{pmatrix} A & B & 0 & 0 & t_x \\ C & D & 0 & 0 & \varphi_x \\ 0 & 0 & A & B & t_y \\ 0 & 0 & C & D & \varphi_y \\ 0 & 0 & 0 & 0 & 1 \end{pmatrix} \quad (1)$$

The entries A, B, C, D describe the paraxial beam propagation parameters of a system that is rotationally symmetrical about the optical axis (propagation axis) if appropriate after corresponding unfolding of the nominal deflection mirrorings. The appended column having the one entry at the last place allows a description of the rotational symmetry-breaking effect of elements which bring about a beam offset and/or a beam tilting. In this case, the parameters $t_x$, $t_y$ are the translational displacements perpendicular to the optical axis, which here corresponds to the z-axis. The parameters $\varphi_x$, $\varphi_y$ denote the angles (in radians) of the beam deviations. For a concatenated optical system comprising K subsections, the transfer matrix $$M = M_K \cdot \ldots \cdot M_1 \quad (2)$$

results from cascading the elementary transfer matrices $M_1, \ldots, M_K$ by matrix multiplication. The elementary transfer matrices from which all measurement resonators explained below are constituted read as follows:

Free-space propagation path by distance z:

$$M_{FS} = \begin{pmatrix} 1 & z & 0 & 0 & 0 \\ 0 & 1 & 0 & 0 & 0 \\ 0 & 0 & 1 & z & 0 \\ 0 & 0 & 0 & 1 & 0 \\ 0 & 0 & 0 & 0 & 1 \end{pmatrix} \quad (3)$$

Passage through lens element with focal length f:

$$M_{Lens} = \begin{pmatrix} 1 & 0 & 0 & 0 & 0 \\ -f^{-1} & 1 & 0 & 0 & 0 \\ 0 & 0 & 1 & 0 & 0 \\ 0 & 0 & -f^{-1} & 1 & 0 \\ 0 & 0 & 0 & 0 & 1 \end{pmatrix} \quad (4)$$

Retroreflector with offset $(s_x, s_y)$ with respect to the optical axis:

$$M_{RR}(s_x, s_y) = \begin{pmatrix} -1 & 0 & 0 & 0 & -2s_x \\ 0 & -1 & 0 & 0 & 0 \\ 0 & 0 & -1 & 0 & -2s_y \\ 0 & 0 & 0 & -1 & 0 \\ 0 & 0 & 0 & 0 & -1 \end{pmatrix} \quad (5)$$

Beam offset by $(s_x, s_y)$:

$$M_{Shift}(s_x, s_y) = \begin{pmatrix} 1 & 0 & 0 & 0 & s_x \\ 0 & 1 & 0 & 0 & 0 \\ 0 & 0 & 1 & 0 & s_y \\ 0 & 0 & 0 & 1 & 0 \\ 0 & 0 & 0 & 0 & 1 \end{pmatrix} \quad (6)$$

Beam deviation by $(\theta_x, \theta_y)$ (in radians):

$$M_{Kink}(\theta_x, \theta_y) = \begin{pmatrix} 1 & 0 & 0 & 0 & 0 \\ 0 & 1 & 0 & 0 & \theta_x \\ 0 & 0 & 1 & 0 & 0 \\ 0 & 0 & 0 & 1 & \theta_y \\ 0 & 0 & 0 & 0 & 1 \end{pmatrix} \quad (7)$$

In a resonator, the beams pass through the optical path multiply, and even infinitely often in the ideal case of infinitely high quality (finesse). In this case, an n-fold pass denotes n-fold cascading of the single resonator path according to $$R_n = M^n R_0 \quad (8)$$

With an eigen composition of the single path matrix according to $$M V = \text{diag}(\mu) V \quad (9)$$

the matrix of the eigenvectors $V = (v_1\ v_2\ v_3\ v_4\ v_5)$ is acquired and the associated eigenvalues $\mu = (\mu_1, \mu_2, \mu_3, \mu_4, \mu_5)$ are obtained.

It can be shown generally that for the 2×2 sub-transfer matrix $$m = \begin{pmatrix} A & B \\ C & D \end{pmatrix} \quad (10)$$

the determinant for the case where the refractive indices at the input and at the output of the path are identical is always identically one. It thus holds true that $\det(m) = AD - BC = 1$ and only three of the four entries are independent. The eigenvalues of the path matrix $M$ following elementary calculation read $$\mu_1 = 1 \quad (11)$$

and $$\mu_{2,3/4,5} = \frac{1}{2}\left[\text{trace}(m) \pm \sqrt{\text{trace}(m)^2 - 4\det(m)}\right] = \frac{A+D}{2} \pm \frac{1}{2}\sqrt{(A+D)^2 - 4} \quad (12)$$

The associated eigenvectors are $$\underline{v}_1 = \begin{pmatrix} (CDt_x - Ct_x - \varphi_x AD + \varphi_x)/(C(A+D-2)) \\ (A\varphi_x - \varphi_x - Ct_x)/(A+D-2) \\ (CDt_y - Ct_y - \varphi_y AD + \varphi_y)/(C(A+D-2)) \\ (A\varphi_y - \varphi_y - Ct_y)/(A+D-2) \\ 1 \end{pmatrix} \quad (13)$$

and $$\underline{v}_{2/4} = \begin{pmatrix} \left(A - D \pm \sqrt{(A+D)^2 - 4}\right)/2C \\ 1 \\ 0 \\ 0 \\ 0 \end{pmatrix} \quad (14)$$

$$\underline{v}_{3/5} = \begin{pmatrix} 0 \\ 0 \\ \left(A - D \pm \sqrt{(A+D)^2 - 4}\right)/2C \\ 1 \\ 0 \end{pmatrix} \quad (15)$$

The following is thus obtained for the beam vector $\underline{R}_n$ after n-fold passing through the resonator path $$\underline{R}_n = \underline{M}^n \underline{R}_0 = \underline{v}_1 R_{1,0} + \mu_2{}^n \underline{v}_2 R_{2,0} + \mu_3{}^n \underline{v}_3 R_{3,0} + \mu_4{}^n \underline{v}_4 R_{4,0} + \mu_5{}^n \underline{v}_5 R_{5,0} \quad (16)$$

wherein the input beam $\underline{R}_0$ is represented by its components $R_{k,0}$, k=1, 2, 3, 4, 5 with regard to the eigenvectors.

The stability of an optical resonator requires the beam vector always to remain limited for an arbitrary number of circulations. That in turn requires the two eigenvalues $\mu_{2,3}$ and $\mu_{4,5}$ likewise to be limited, according to $$|\mu_{2,3}| \le 1, |\mu_{4,5}| \le 1 \quad (17)$$

This requirement in turn is translated directly into the stability condition $$|g| = |(A+D)/2| \le 1 \quad (18)$$

wherein the so-called stability parameter is defined by g=(A+D)/2. For a stable resonator path, the two eigenvalues and the associated eigenvectors necessarily become complex and then form in each case mutually conjugate pairs according to $$\mu_{2,3/4,5} \rightarrow \mu_{+/-} = g \pm i\sqrt{1-g^2} = \cos(\theta) \pm i\sin(\theta) = \exp(\pm i\theta) \quad (19)$$

and $$\underline{v}_{2/4} \rightarrow \underline{v}_{x+/-} = \begin{pmatrix} \left(A - D \pm \sqrt{1-g^2}\right)/2C \\ 1 \\ 0 \\ 0 \\ 0 \end{pmatrix} \quad (20)$$

$$\underline{v}_{3/5} \rightarrow \underline{v}_{y+/-} = \begin{pmatrix} 0 \\ 0 \\ \left(A - D \pm i\sqrt{1-g^2}\right)/2C \\ 1 \\ 0 \end{pmatrix} \quad (21)$$

with the substitution $\cos(\theta) = g$. The following is thus obtained for the beam vector after a path has been traversed n-fold $$\underline{R}_n = \underline{v}_1 R_{1,0} + \exp(+in\theta)(\underline{v}_{x+} R_{x+,0} + \underline{v}_{y+} R_{y+,0}) + \ldots + \exp(-in\theta)(\underline{v}_{x-} R_{x-,0} + \underline{v}_{y-} R_{y-,0}) \quad (22)$$

The oscillating and amplified-limited behavior of a bound beam in the resonator becomes explicitly clear from this.

A gaussian beam in the fundamental mode (TEM00) is described completely by the complex beam parameter q. The latter combines the two beam variables of radius R of curvature and beam size w. It is defined as follows by way of its reciprocal:

$$\frac{1}{q} = \frac{1}{R} - \frac{i}{\pi}\frac{\lambda}{w^2} \quad (23)$$

wherein $\lambda$ stands for the wavelength of the light field. The propagation of the beam parameter is given by the expression $$q_{out} = \frac{Aq_{in} + B}{Cq_{in} + D}. \quad (24)$$

in the formalism of the transfer matrices. In this case, $q_{out}$ denotes the output-side beam parameter and $q_{in}$ denotes the input-side beam parameter.

The stable modes of a resonator have to satisfy two stationarity conditions. The stationarity of the chief ray $\underline{R}_c$ along which the light field propagates requires firstly $$\underline{R}_c = \underline{M}\underline{R}_c \quad (25)$$

The solution for the chief ray corresponds precisely to the eigenvector of the resonator path with respect to the eigenvalue $\mu_1 = 1$ according to $\underline{R}_c = \underline{v}_1$, wherein $\underline{v}_1$ is specified in the above section.

The stationarity of the complex beam parameter of the radiation field propagating along the chief ray requires secondly $$q = \frac{Aq + B}{Cq + D}. \quad (26)$$

This equation has two solutions for the eigenbeam parameter. They explicitly read as follows $$q_{+/-} = (A - D \pm 2i\sqrt{1 - g^2})/2C. \quad (27)$$

This finally yields as a result at the input of the resonator path for the wavefront radius $R_m$ of curvature of the eigenmodes the expression $$R_m = 1/\text{real}(1/q_{+/-}) = \frac{4 + (A-D)^2 - 4g^2}{2C(A-D)} \quad (28)$$

and for the beam size of the eigenmodes the expression $$w_m = \sqrt{\lambda/\pi \cdot 1/|\text{imag}(1/q_{+/-})|} = \sqrt{\frac{\lambda}{\pi}\left|\frac{4 + (A-D)^2 - 4g^2}{4C\sqrt{1-g^2}}\right|} \quad (29)$$

FIG. 1C shows a derived equivalent circuit diagram concerning the embodiments from FIGS. 1A-1B for the single resonator path for description in the extended formalism of paraxial matrix optics. The corresponding transfer matrix reads as follows by way of example for the case of a curved stationary resonator mirror 110 in accordance with FIG. 1A $$\underline{M} = \underline{M}_{FS}(L)\underline{M}_{RR}(\vec{s})\underline{M}_{FS}(L')\underline{M}_{FS}(L')\underline{M}_{RR}(\vec{s})\underline{M}_{FS}(L)\underline{M}_{Lens}(R/2) = \begin{pmatrix} 1-4(L+L')/R & 2(L+L') & 0 & 0 & 0 \\ -2/R & 1 & 0 & 0 & 0 \\ 0 & 0 & 1-4(L+L')/R & 2(L+L') & 0 \\ 0 & 0 & -2/R & 1 & 0 \\ 0 & 0 & 0 & 0 & 1 \end{pmatrix} \quad (30)$$

In this case, L denotes the variable distance between the stationary curved resonator mirror 110 and the retroreflector 120 forming the measurement target, L' denotes the variable distance between the stationary planar inverting mirror (="recirculation mirror") 130 and the movable retroreflector 120, R denotes the radius of curvature of the curved resonator mirror 110 and $(s_x, s_y)$ denotes the transverse displacement of the retroreflector 120 with respect to the optical axis (which runs in the z-direction in the coordinate system depicted).

On account of the identical vanishing of the first four entries in the last column of the transfer matrix, the following holds true for the beam vector of the chief ray $\underline{R}_c=(0,0,0,0,1)^T$. Thus, as desired, the chief ray is independent of the drift of the retroreflector 120 forming the measurement target. The effective resonator length is $L_{eff}=L+L'$. From a displacement of the retroreflector 120 forming the measurement target in the measurement direction by ΔL, it follows that $\Delta L_{eff}=2\Delta L$. Satisfying the stability condition requires $L+L'\leq R\leq\infty$. The parameters of the TEM00 eigenmodes result from the abovementioned equations as $R_m=R$ and $w_m=\sqrt{\lambda R/\pi} (R/(L+L')-1)^{-1/4}$.

Figure 2:
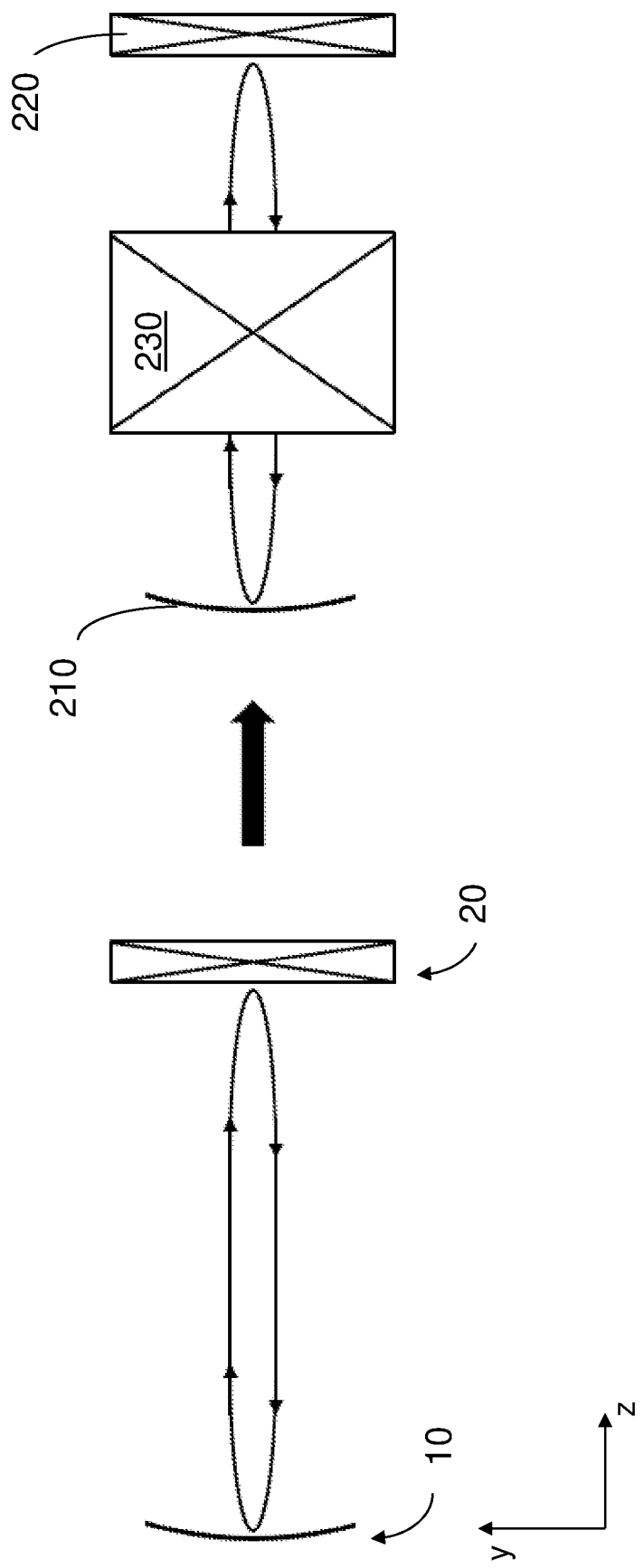
FIG. 2 shows a diagram for explaining a concept according to the invention.

FIG. 2 shows, in a further schematic illustration, a diagram for explaining the concept according to the invention. A conventional optical resonator with a stationary resonator mirror 10 and measurement target 20 is indicated in the left-hand part of FIG. 2. According to the invention, a recirculation optical unit 230 (realized by the inverting mirror 130 in FIG. 1) is provided (as indicated in the right-hand part of FIG. 2) between stationary resonator mirror 210 and measurement target 220.

Figure 3B:
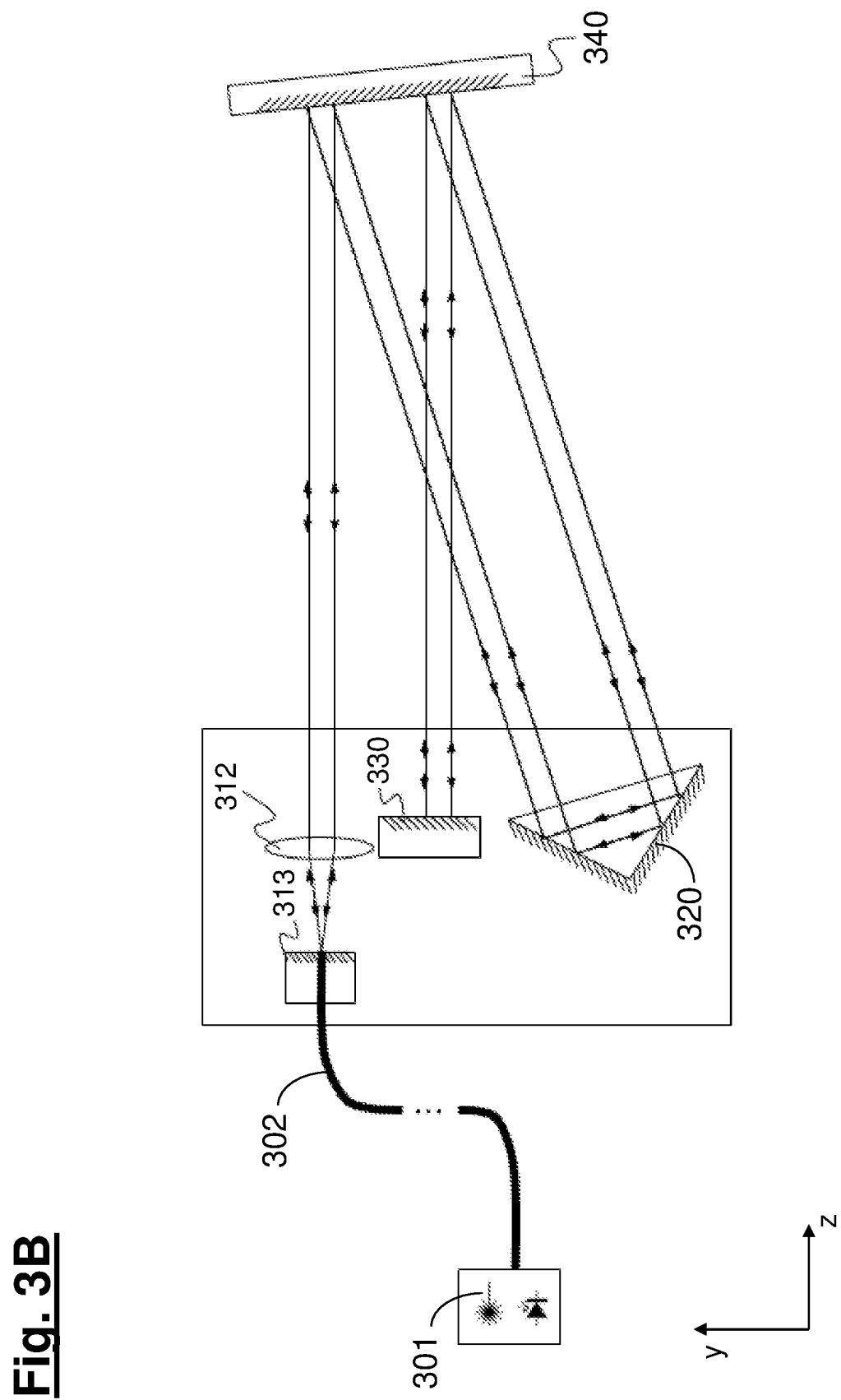
FIG. 3B shows a schematic illustration for explaining a further embodiment of a measuring assembly according to the invention.

FIGS. 3A-3B show schematic illustrations for explaining further embodiments of a measuring assembly according to the invention, wherein components which are analogous or have substantially the same function in comparison with FIGS. 1A-1B are designated by reference numerals increased by "200". The embodiments in FIGS. 3A-3B differ from those from FIGS. 1A-1B in that instead of the retroreflector 120, a plane mirror 340 serves as a movable measurement target, wherein the retroreflector 320 is arranged at the location of the stationary part of the resonator.

The transfer matrix of the path unfolded by the nominal angles reads as follows by way of example for the exemplary embodiment of a curved fixed resonator mirror 310 in accordance with FIG. 3A $$\underline{M} = \begin{pmatrix} 1-4(L+2L'+L'')/R & 2(L+2L'+L'') & 0 & 0 & 0 \\ -2/R & 1 & 0 & 0 & 0 \\ 0 & 0 & 1-4(L+2L'+L'')/R & 2(L+2L'+L'') & 0 \\ 0 & 0 & -2/R & 1 & 0 \\ 0 & 0 & 0 & 0 & 1 \end{pmatrix} \quad (31)$$

Therein, L denotes the variable distance between the stationary curved resonator mirror 310 and the movable plane mirror 340, L' denotes the variable distance between the stationary retroreflector 320 and the movable plane mirror 340, L" denotes the variable distance between the stationary inverting mirror 330 and the movable plane mirror 340 and R denotes the radius of curvature of the curved stationary resonator mirror 310.

On account of the identical vanishing of the first four entries in the last column of the transfer matrix in accordance with (2), the following holds true for the beam vector of the chief ray $\underline{R}_c=(0,0,0,0,1)^T$. Thus—as desired—here too, the chief ray is independent of the drift of the measurement target. The effective resonator length is $L_{eff}=L+2L'+L''$. From a displacement of the plane mirror 340 forming the measurement target in the measurement direction by ΔL, it follows that $\Delta L_{eff}=4\Delta L$. Satisfying the stability condition requires $L+2L'+L''\leq R\leq\infty$. For parameters of the TEM00 eigenmodes, the following are obtained: $R_m=R$ and $w_m=\sqrt{\lambda R/\pi} (R/(L+2L'+L'')-1)^{-1/4}$.

The embodiment illustrated in FIG. 3B differs from that from FIG. 3A in turn (analogously to FIGS. 1A-1B) merely in that a stationary "cat's eye optical unit" comprising a Fourier lens element 312 with a mirror 313 arranged in its focal plane is used instead of the stationary curved resonator mirror 310.

FIG. 3C shows, on the basis of the embodiments from FIGS. 3A-3B and from the direction of the plane mirror 340 forming the measurement target, some possible configurations that differ in their geometric arrangement.

FIGS. 4A-4B show schematic illustrations for explaining further embodiments of a measuring assembly according to the invention, wherein in turn components which are analogous or have substantially the same function in comparison with FIGS. 3A-3B are designated by reference numerals increased by "100".

In accordance with FIG. 4A, a measurement beam once again passes via a unit 401 (the arrangement and functioning of which will be described in even greater detail with reference to FIGS. 6-11) and an optical fiber 402 into the resonator through the curved stationary resonator mirror 410 (having mirror surface 411) and, after passing through a free-space path, is incident on a polarization-optical beam splitter 450 comprising a beam splitter layer 450a. The p-polarized component of the measurement beam is transmitted, whereas the s-component is reflected out of the resonator and thus destroyed. The now p-polarized beam is transformed into a circularly polarized beam by a lambda/4 plate 460 and passes through a further free-space path as far as the plane mirror 440 forming the measurement target. It is reflected back there and once again passes through the lambda/4 plate 460, whereby it is transformed into a linearly polarized beam having 90° rotation relative to the original p-polarization, that is to say into an s-polarized beam.

The now s-polarized beam is completely reflected at the polarization-optical beam splitter 450 and guided into the (e.g. monolithically attached) retroreflector 420. There the beam is reflected back with a parallel offset and is deflected once again at the beam splitter layer 450a in the direction of the plane mirror 440 forming the measurement target. Upon passing through the lambda/4 plate, the beam is circularly polarized again and, after a free-space path, reaches the plane mirror 440 forming the measurement target, and is then reflected back again at said plane mirror. After passing through the lambda/4 plate once again, it assumes the original p-polarization state again, passes through the beam splitter layer 450a without deflection and finally reaches the stationary inverting mirror 430. Proceeding from there, the entire optical path is traversed identically in the opposite order, such that at the end of a pass the beam is incident on the curved stationary resonator mirror 410 again in its original position and with the same inclination. Thus the circle closes and the next circulation is initiated with the reflection at the curved resonator mirror 410. It is assumed here that the retroreflector is embodied in such a way that the polarization of the beam is maintained after the pass, which can be achieved through coating with a suitably designed optical multilayer coating system on the mirror surfaces.

The embodiment illustrated in FIG. 4B differs from that from FIG. 4A in turn (analogously to FIGS. 1A-1B) merely in that a stationary "cat's eye optical unit" comprising a Fourier lens element 412 with a mirror 413 arranged in its focal plane, said mirror being defocused in a defined manner, is used instead of the stationary curved resonator mirror 410.

In accordance with FIGS. 4A-4C, as a result, in contrast to FIGS. 3A-3B, in particular in each case a nominally normal incidence on the measurement target 440 embodied as a plane mirror is achieved by the "retroreflector beam path" being folded directly onto the optical axis with the use of the polarization-optical beam splitter 450.

FIGS. 5A-5B show schematic illustrations for explaining further embodiments of a measuring assembly according to the invention, wherein in turn components which are analogous or have substantially the same function in comparison with FIGS. 4A-4B are designated by reference numerals increased by "100".

In the embodiments in FIGS. 5A-5B, an optical group 520 comprising two lens elements 521, 523 in a Kepler arrangement (afocal arrangement) is used instead of the retroreflector. A mirror 522 (which may also be referred to as a retina mirror) having a central opening is situated here in the common focal plane of the two said lens elements 521, 523—the so-called spatial filter plane—and said mirror reflects back the beam path returning from the plane mirror 540 forming the measurement target provided that the plane mirror 540 has a sufficiently large setting angle. The transfer matrix of the unfolded nominal system (in which the nominal setting angle of the plane mirror 540 is folded out) reads $$\underline{\underline{M}}_{ARCO} = \begin{pmatrix} -1 & -4(L-F_2)F_1^2/F_2^2 & 0 & 0 & 4\theta_x(L-F_2)F_1/F_2 \\ 0 & -1 & 0 & 0 & 0 \\ 0 & 0 & -1 & -4(L-F_2)F_1^2/F_2^2 & 4\theta_y(L-F_2)F_1/F_2 \\ 0 & 0 & 0 & -1 & 0 \\ 0 & 0 & 0 & 0 & 1 \end{pmatrix} \quad (32)$$

In this case, L denotes the variable distance between the output-side lens element 523 and the plane mirror 540 forming the measurement target, and $F_1$ and $F_2$ denote the focal lengths of the two lens elements 521, 523. $\vec{\theta} = (\theta_x, \theta_y)$ stands for the inclination deviations of the plane mirror 540 forming the measurement target relative to its nominal values. The underlying paraxial equivalent scheme for the arrangement illustrated in FIG. 5C comprising plane mirror 530 and optical group 520 is shown in FIG. 5D. The output-side lens element 523 together with the (retina) mirror 522 in its focal plane forms a functional retroreflector in the form of a cat's eye. In this case, the focal plane of the first lens element 521 is selected as an input-side reference plane. The transfer matrix shows the property of retroreflection in the form of the identical vanishing of its entries $M_{5,1}$ and $M_{5,3}$.

Furthermore, in accordance with FIGS. 5A-5B, relative to the optical beam path downstream of the optical group 520 described above (that is to say at the "system output" thereof) analogously to the embodiments described above, a plane mirror 530 as a recirculation optical unit is inserted, which reflects the beam path back on itself.

Figure 5C:
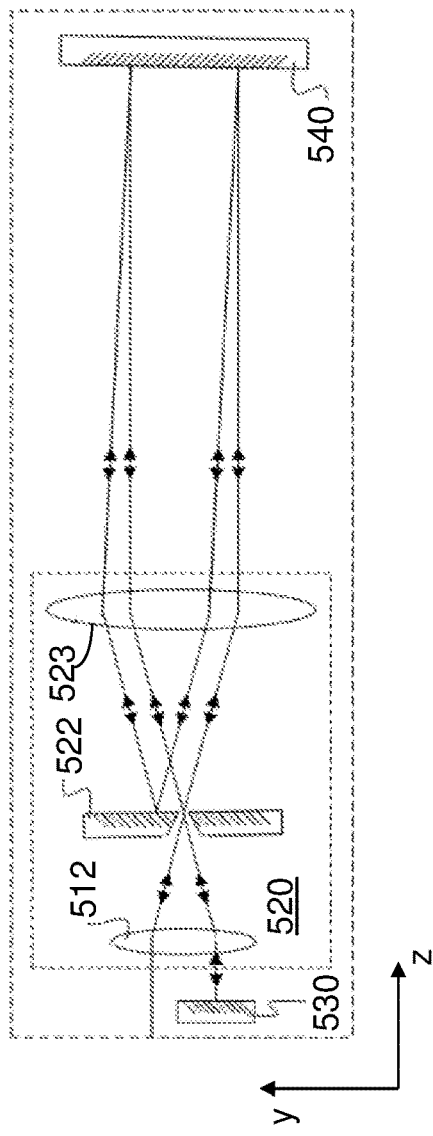
FIG. 5C shows a schematic illustration of an arrangement comprising a plane mirror and an optical group.
Figure 5D:
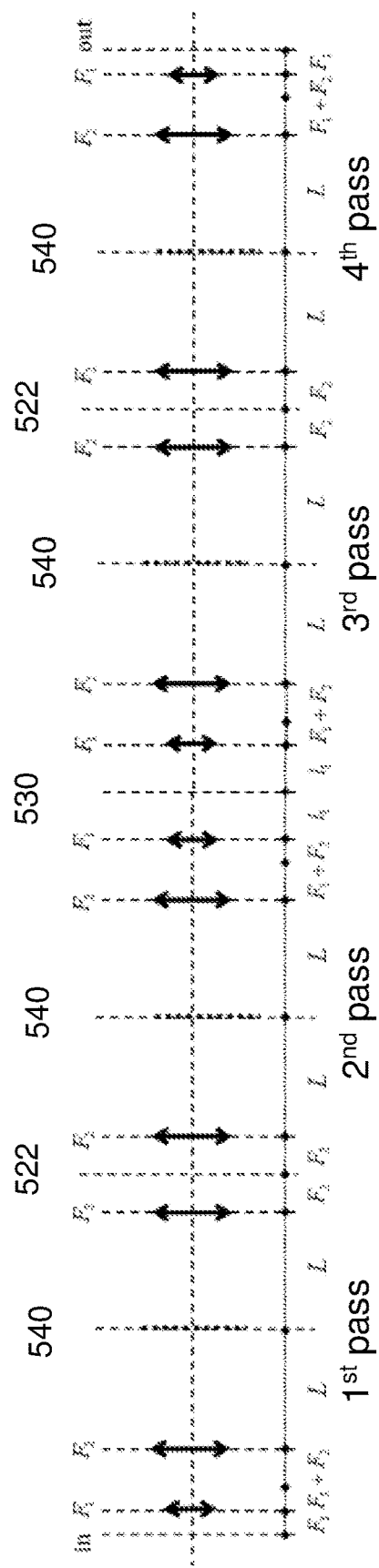
FIG. 5D shows an underlying paraxial equivalent scheme for the arrangement illustrated in FIG. 5C.

The transfer matrix of the unfolded nominal cavity or of the optical resonator in accordance with FIGS. 5A-5C reads $$\underline{\underline{M}}_{RARCO} = \begin{pmatrix} 1 & 2l_1 + 8(L-F_2)F_1^2/F_2^2 & 0 & 0 & 0 \\ 0 & 1 & 0 & 0 & 0 \\ 0 & 0 & 1 & 2l_1 + 8(L-F_2)F_1^2/F_2^2 & 0 \\ 0 & 0 & 0 & 1 & 0 \\ 0 & 0 & 0 & 0 & 1 \end{pmatrix}. \quad (33)$$

The variables contained therein have already been defined above apart from the distance $l_1$ between the plane mirror 530 and the input-side lens element 521. Owing to the recirculation via the plane mirror 530, input and output are identical, and the vanishing of the first four entries of the last column indicates that the targeted robustness vis-à-vis parasitic tiltings of the plane mirror 540 forming the measurement target is achieved.

The optical unit described above is completed to form an optical resonator in accordance with FIGS. 5A-5C by virtue of it being terminated on the input side with a curved mirror 510 (in accordance with FIG. 5A) or alternatively with a "cat's eye optical unit" comprising a Fourier lens element 512 with a mirror 513 arranged in its focal plane (in accordance with FIG. 5B).

The transfer matrix for the single path passage of such a resonator for the embodiment with a curved mirror in accordance with FIG. 5A reads $$\underline{\underline{M}} = \begin{pmatrix} 1 + (F_2 - L)\frac{16F_1^2}{RF_2^2} & -8(F_2 - L)\frac{F_1^2}{F_2^2} & 0 & 0 & 0 \\ -2/R & 1 & 0 & 0 & 0 \\ 0 & 0 & 1 + (F_2 - L)\frac{16F_1^2}{RF_2^2} & -8(F_2 - L)\frac{F_1^2}{F_2^2} & 0 \\ 0 & 0 & -2/R & 1 & 0 \\ 0 & 0 & 0 & 0 & 1 \end{pmatrix} \quad (34)$$

wherein both the curved resonator mirror 510 and the plane mirror 530, which brings about the recirculation, lie in the focal plane of the input-side lens element 521 of the optical group 520.

On account of the identical vanishing of the first four entries in the last column of the transfer matrix, it holds true for the beam vector of the chief ray that $\underline{R}_c = (0,0,0,0,1)^T$. Thus, as desired, the chief ray is independent of the drift of the plane mirror 540 forming the measurement target. The effective resonator length is $L_{eff} = 4(L-F_2)$ and is counted from the output-side focal plane of the output-side lens element 523. From a displacement of the plane mirror 540 forming the measurement target in the measurement direction by $\Delta L$, it follows that $\Delta L_{eff} = 4\Delta L$.

Satisfying the Stability Condition $$|g| = \left|1 - 4(L - F_2)\frac{2F_1^2}{RF_2^2}\right| \leq 1$$

requires $L_{eff} = 4(L - F_2) \leq RF_2^2/F_1^2 < \infty$.

As a result of the imaging properties of the optical group 520 (which forms an effective Keplerian telescope), the radius of curvature of the input-side resonator mirror 510 is transformed into an effective radius of curvature $R_{eff} = R F_2^2/F_1^2$. The scaling factor corresponds precisely to the longitudinal magnification of the afocal optical unit.

In all the embodiments described above with reference to FIGS. 1A-5D, a retroreflector present in each case can also be configured in a "cat's eye configuration" (i.e. comprising a Fourier optical unit or lens element with a mirror arranged in its focal plane). This can take account of the circumstance that the losses in the optical resonator must typically be limited to a maximum of 0.1%-0.5%, which is hampered in the case of the configuration of the retroreflector with a plurality of reflection surfaces, on account of the plurality of reflections that occur.

It is furthermore assumed that the retroreflector is embodied such that the polarization of the beam is maintained after the pass. The property of polarization maintenance of the retroreflector can be achieved by coating by a suitably designed optical multilayer coating system on the mirror surfaces.

Concepts for the realization of a frequency-based length or position measurement are described below with reference to the schematic illustrations in FIGS. 6-9.

Figure 6:
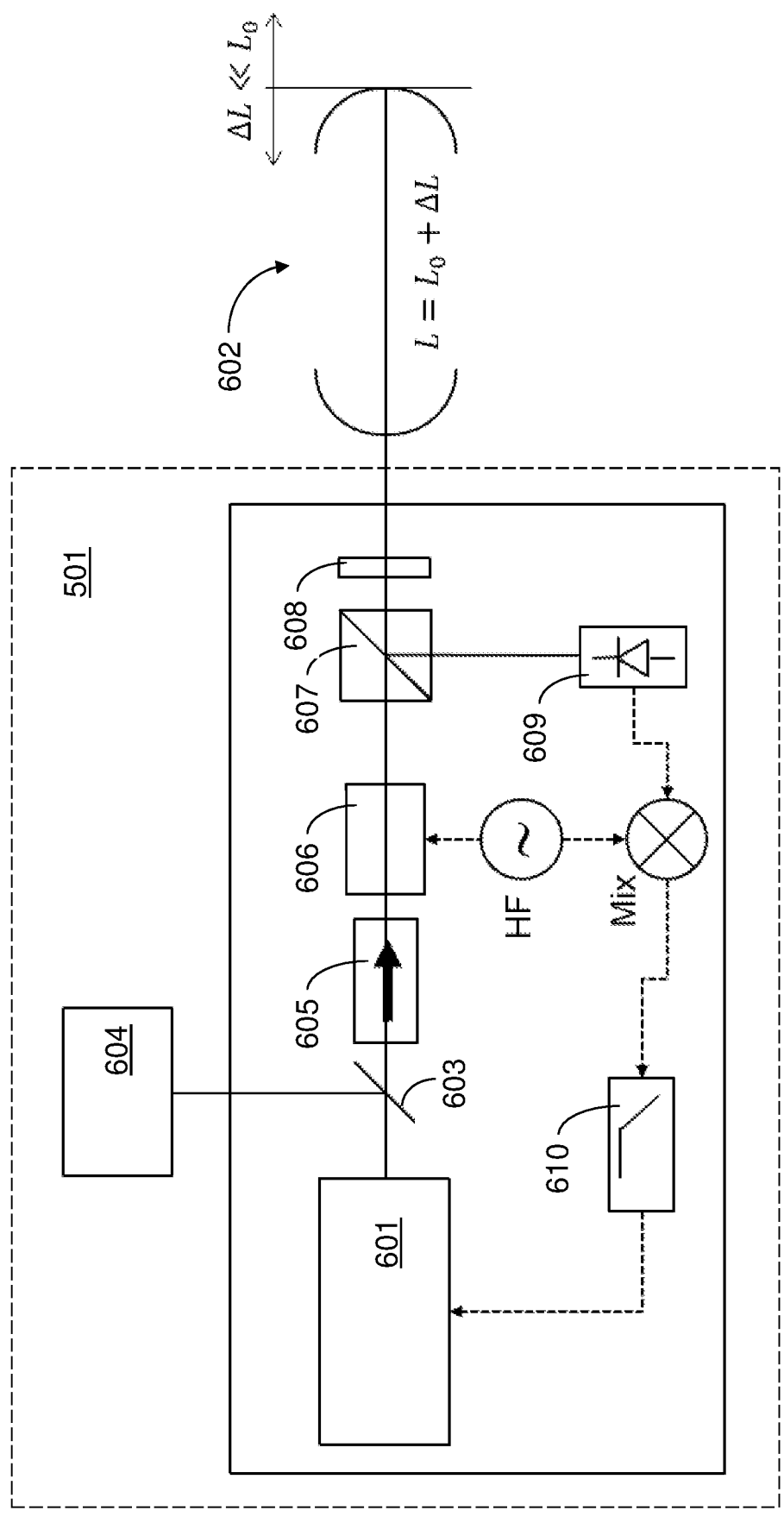
FIG. 6 shows a schematic illustration for explaining a concept for the realization of a frequency-based length or position measurement.

In this case, FIG. 6 firstly shows a diagram for explaining the principle known per se according to which a tunable laser 601 follows a frequency of a resonator 602 using a suitable control loop (according to the Pound-Drever-Hall method in the example illustrated), such that the length L of the resonator 602 that is ultimately to be measured is encoded as a frequency of the tunable laser 601.

In FIG. 6, the region enclosed by a dashed border corresponds to the unit "501" from FIGS. 5A, 5B (or the units "101" in FIGS. 1A, 1B, "301" in FIGS. 3A, 3B, and "401" in FIGS. 4A, 4B).

The arrangement in accordance with FIG. 6 comprises a Faraday isolator 605, an electro-optical modulator 606, a polarization-optical beam splitter 607, a lambda/4 plate 608, a photodetector 609 and a low-pass filter 610. For frequency measurement, part of the light emitted by the tunable laser 601 is coupled out via a beam splitter 603 and fed to an analyzer 604 for frequency measurement. The actual frequency measurement in the analyzer 604 can be effected for example by way of the comparison with a frequency reference (e.g. an fs frequency comb of a femtosecond laser, as also explained below).

Figure 7:
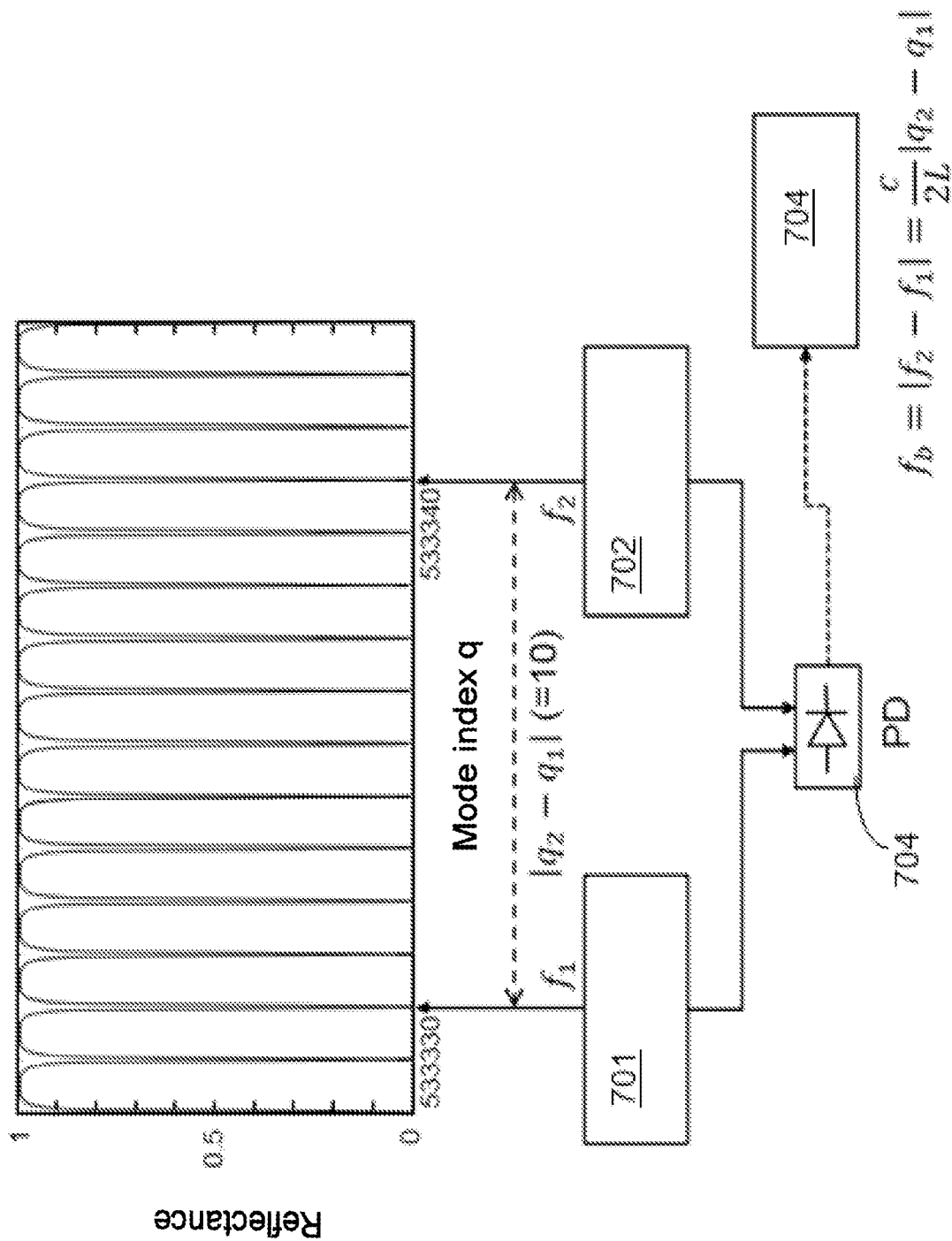
FIG. 7 shows a further schematic illustration for explaining a concept for the realization of a frequency-based length measurement wherein two tunable lasers are controlled to two different resonator modes.

In accordance with FIG. 7, in a further development of the above-described principle of frequency-based length measurement, it is also possible for two tunable lasers 701, 702 to be controlled (e.g. likewise in accordance with the Pound-Drever-Hall method) to two different resonator modes that are known in terms of their mode index spacing. The beat or difference frequency $f_{beat} = \Delta f = f_2 - f_1$ of the signal obtained by the superimposition of the radiation from the two lasers 701, 702 on a photodetector 703 is determined with a frequency counter 704. The sought length L of the resonator can then be determined in accordance with $$L = c/2\Delta q/f_{beat} \quad (35)$$

wherein $\Delta q$ denotes the mode spacing in the frequency comb of the resonator. The mode spacing $\Delta q$ can be obtained e.g. by way of the tuning of one of the two laser frequencies proceeding from a common starting frequency and counting through the traversed reflection minima of the frequency comb of the resonator.

Figure 8:
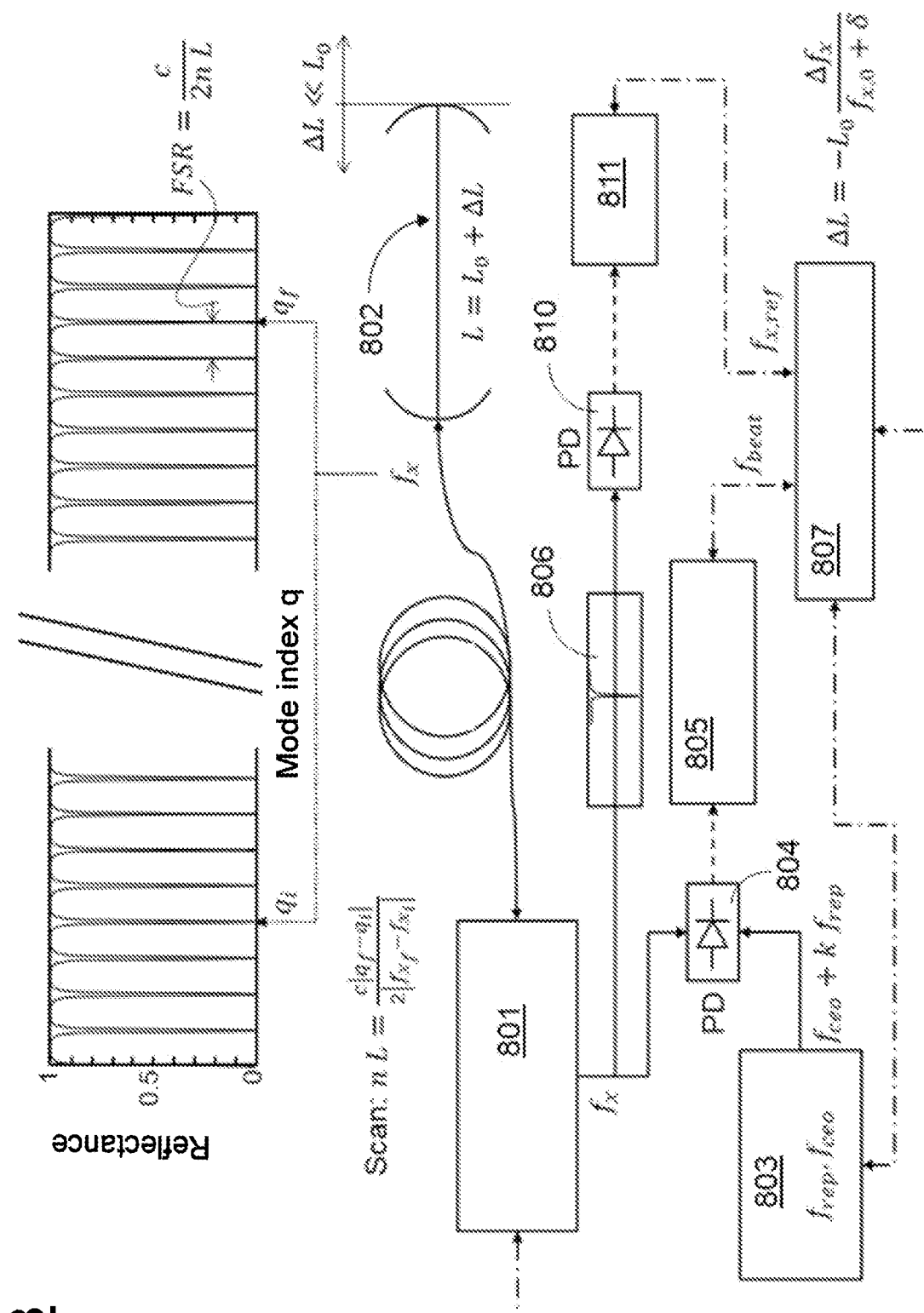
FIG. 8 shows a further schematic illustration for explaining the principle of frequency-based length measurement on the basis of the beat between a tunable laser stabilized to a resonator mode of a resonator and a femtosecond laser.

FIG. 8 serves for explaining the principle of frequency-based length measurement on the basis of the beat between a tunable laser 801 stabilized to a resonator mode of a resonator 802 and a femtosecond laser 803. The beat between the laser beams of the tunable laser 801 and of the femtosecond laser 803 is realized by their superimposition on a fast photodetector 805. The individual beat frequencies are extracted from the analysis of the beat signal, which comprises a superimposition of a multiplicity of beats occurring simultaneously. In accordance with FIG. 8, a frequency standard 806 (e.g. in the form of a gas cell, in particular for instance an acetylene gas cell in the S and C telecommunications frequency bands around 1500 nm) is furthermore provided, in order to ascertain the frequency comb index. A photodetector 810 and a signal analyzer 811 are disposed downstream of the frequency standard 806.

The sought frequency of the tunable laser 801 can be reconstructed from knowledge of the individual beat frequencies and knowledge of the mode indices in accordance with FIG. 8.

In this case, the carrier envelope frequency (comb offset frequency) of the femtosecond laser 803 is given by $$f_{ceo} = \frac{\Delta\varphi}{2\pi f_{ceo} = \frac{\Delta\varphi 1}{2\pi T_{rep}}} \frac{1}{T_{rep}} = \frac{\Delta\varphi}{2\pi} f_{rep} \qquad (36)$$

and can be measured with the aid of a nonlinear, so-called f-2f interferometer and can be kept constant using a control loop or be eliminated with an optically nonlinear process. The comb offset frequency $f_{ceo}$ and the pulse repetition frequency $$f_{rep} = \frac{1}{T_{rep}}$$

are in the radio-frequency range and can be measured highly accurately and stabilized on atomic clocks. The wide optical spectrum of said femtosecond laser 803 comprises a multiplicity of sharp lines with a constant frequency spacing $f_{rep}$ according to $$f_k = f_{ceo} f_{ceo} = \frac{\Delta\varphi}{2\pi}\frac{1}{T_{rep}} + k f_{rep}, k \in \mathbb{N} \gg 1 \qquad (37)$$

wherein k denotes the comb index.

The numerous possible beat frequencies between a tunable laser with frequency to be determined $f_x$ and a femtosecond laser whose parameters are accurately known generally read $$f_{beat}(k) = |f_x \pm (f_{ceo} + k f_{rep})|, k \in \mathbb{N} \gg 1 \qquad (38)$$

Figure 9A:
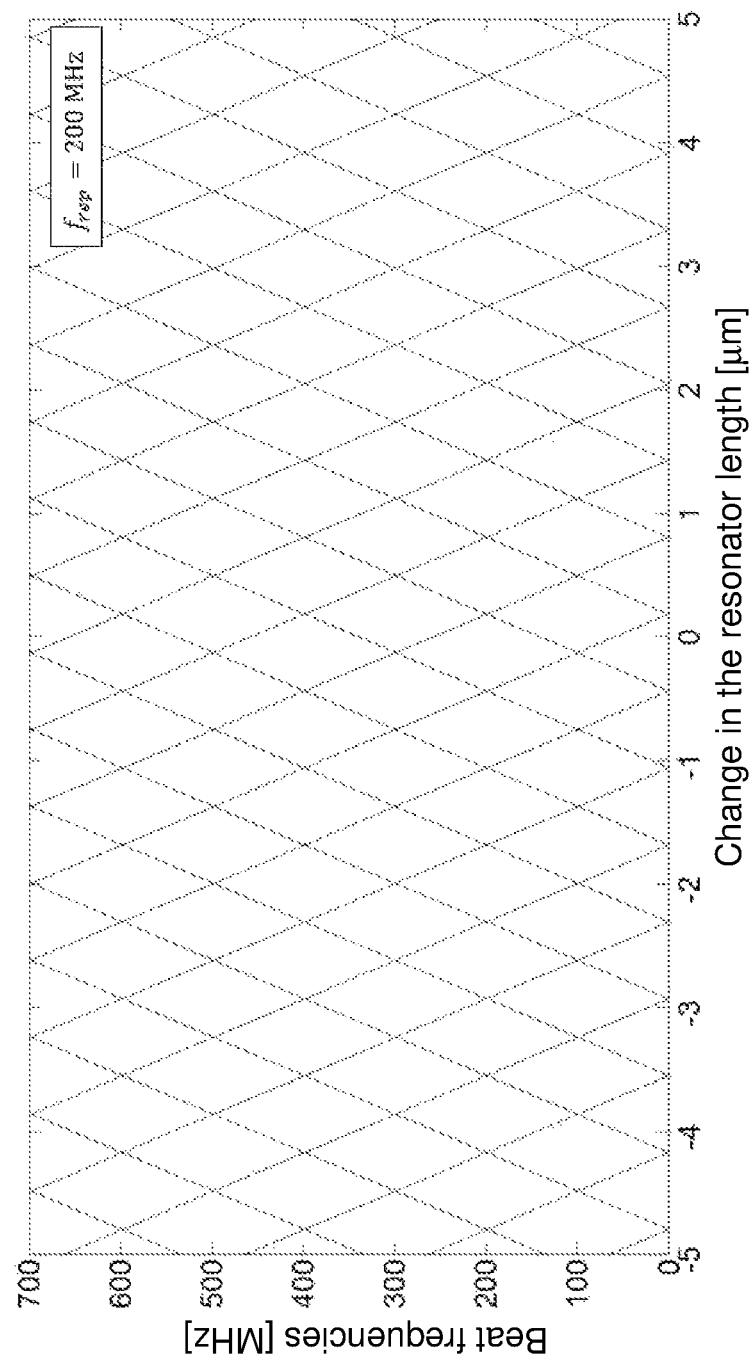
FIG. 9A shows an exemplary spectrum of the beat frequencies between a tunable laser stabilized to a resonator mode and a femtosecond laser as a function of the change in the resonator length.
Figure 9B:
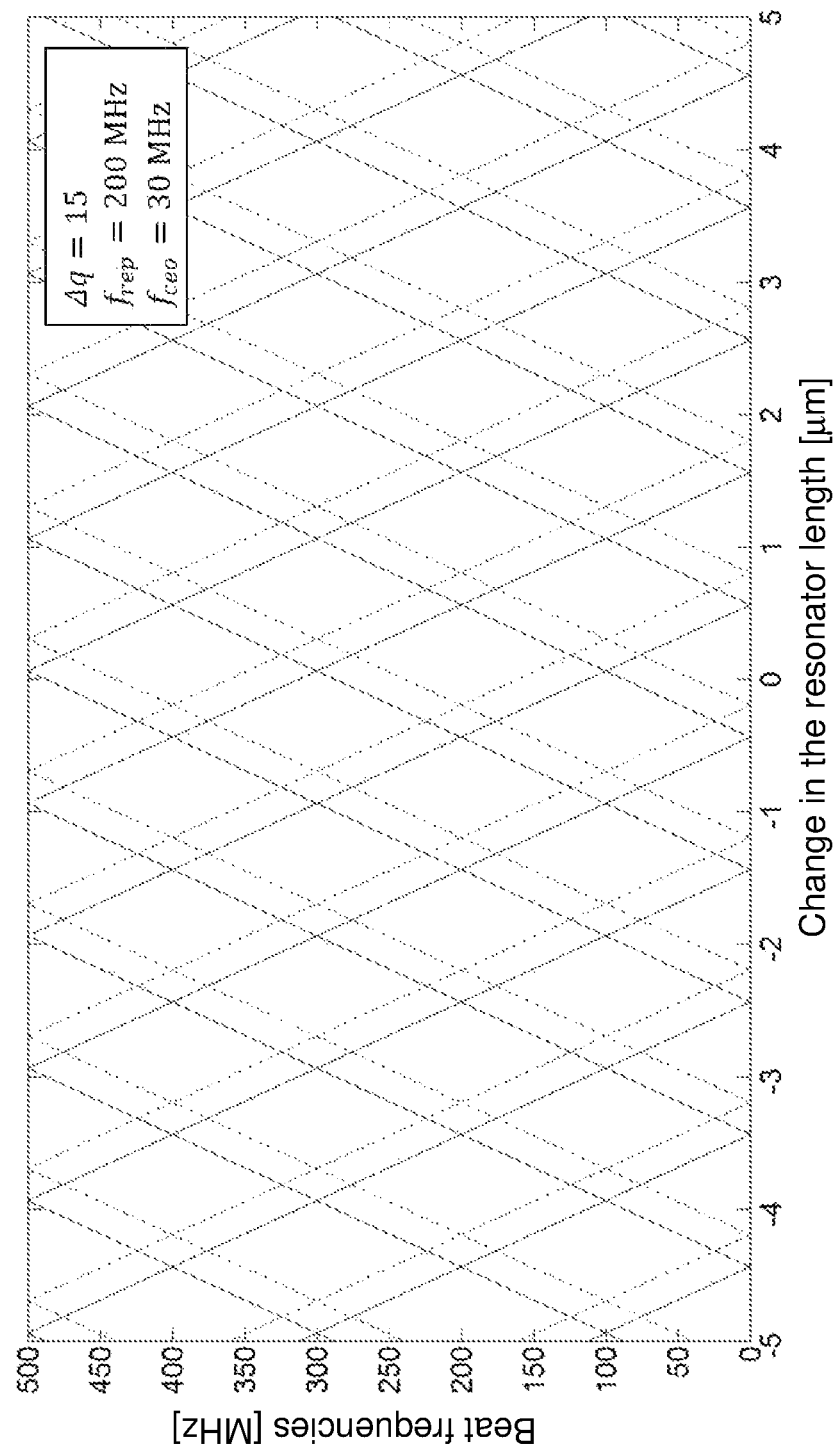
FIG. 9B schematically shows a diamond pattern illustrating two interlaced grids of beat frequencies for the laser frequencies of two lasers.

An exemplary spectrum of the beat frequencies between a tunable laser stabilized to a resonator mode and a femtosecond laser as a function of the change in the resonator length is shown in FIG. 9A. This involves a diamond pattern which is periodic along both axes, and which can also be referred to as a beat grid. An ambiguity resulting from this, in principle, has to be eliminated, analogously to counting distance-measuring interferometry, by including in the counting without any gaps the passages through cell boundaries in the diamond pattern proceeding from a start position defined by zeroing. Any uncertainty that still remains here with regard to the counting direction and the elimination of this uncertainty will be discussed below with reference to FIG. 10.

Figure 10:
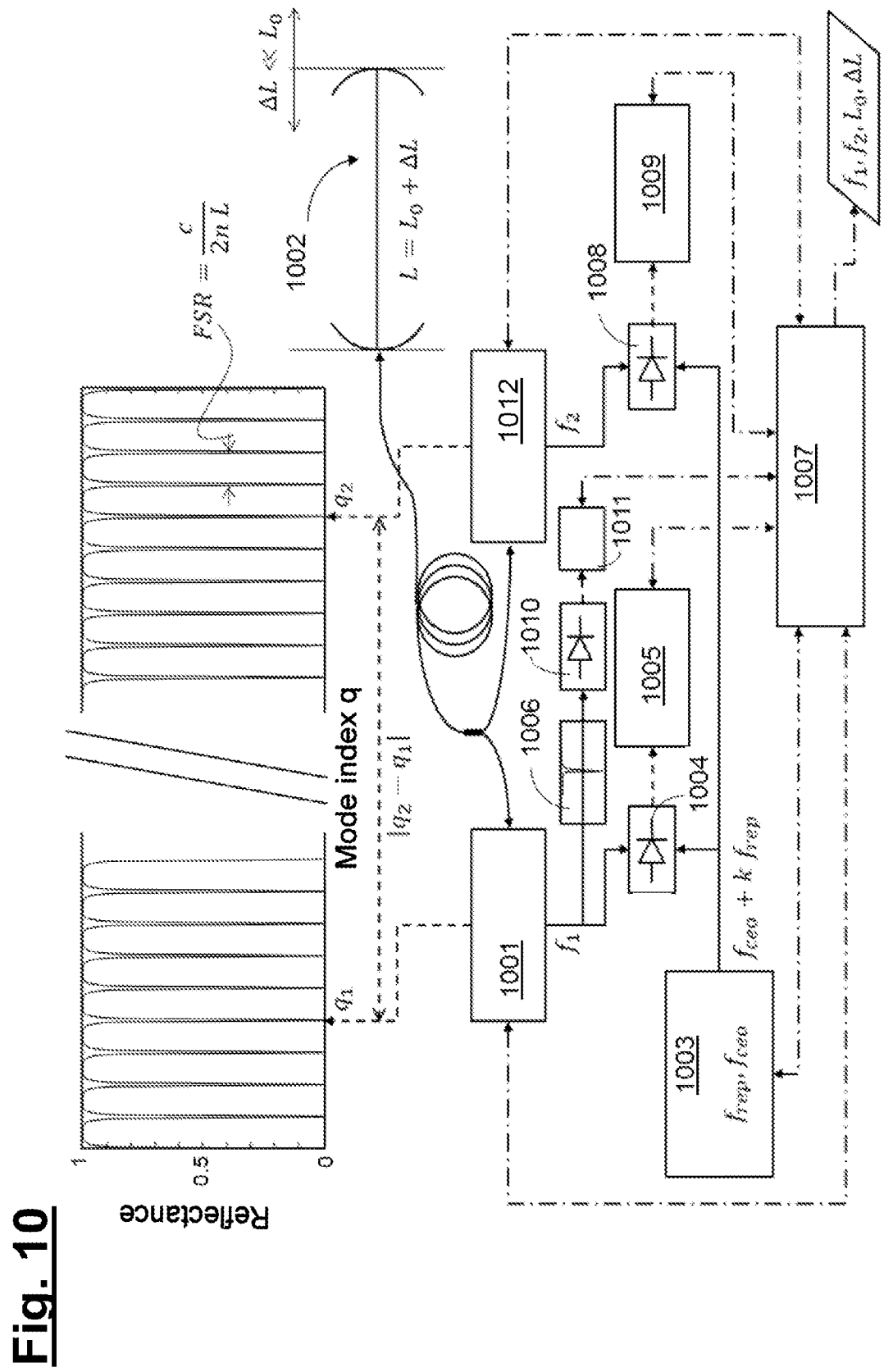
FIG. 10 shows an extension of the arrangement from FIG. 8.

FIG. 10 shows an extension of the arrangement from FIG. 8, wherein components analogous or substantially functionally identical to FIG. 8 are designated by reference numerals increased by "200".

In accordance with FIG. 10, in addition to the first tunable laser 1001, a second tunable laser 1012 with photodetector 1008 and assigned beat frequency analyzer unit 1009 is integrated into the measuring system. The second laser 1012 is likewise stabilized to a selected resonator mode of the optical resonator, such that the following holds true for the frequency of the laser beam generated by the second tunable laser 1012:

$$f_2 = f_1 + f_{ceo} = \frac{\Delta\varphi}{2\pi}\frac{1}{T_{rep}}(L)\Delta q. \qquad (39)$$

In this case FSR(L)=c/2L denotes the so-called free spectral range corresponding to the frequency spacing between adjacent modes in the mode comb of the resonator.

The laser frequencies of the lasers 1001 and 1012 in FIG. 10 have two interlaced grids of beat frequencies (analogously to the diamond pattern shown schematically in FIG. 9B), on the basis of which it is possible to eliminate a "direction ambiguity" that otherwise exists with regard to the counting direction (when counting the passages through cell boundaries in the diamond pattern in FIG. 9A): With the aid of the laser beam which is generated by said further laser 1012 and is coupled to the frequency comb of the optical resonator, the solution to the unambiguity problem with regard to the counting direction is accomplished here since the counting direction can always be ascertained unambiguously with the aid of the additional information in the form of the frequencies of the second beat frequency grid (cf. FIG. 9B). In this case, it is advantageously possible to determine directly at any time the absolute length of the optical resonator in accordance with $$L = \frac{c}{2 f_{ceo} = \frac{\Delta\varphi 1}{2\pi T_{rep}}} q_{2,1} \qquad (40)$$

and thus to obtain the absolute (connected) value for the further incremental counting in accordance with $$\delta L = -L \frac{\delta f_q}{f_q + f_{ceo} = \frac{\Delta\varphi 1}{2\pi T_{rep}} FSR \delta_g} \approx -L \frac{\delta f_q}{f_{ceo} = \frac{\Delta\varphi 1}{2\pi T_{rep}} f_q} \qquad (41)$$

During incremental counting, it is possible to disregard the change in the offset index $\delta_g$, which also encompasses the known Gouy phase, such that the relative frequency change stands directly for a relative length change. With knowledge of the absolute length determined previously, the absolute length change of interest can be calculated directly from the relative length change. As a result, a frequency-based length measurement is realized with the arrangement proposed in FIG. 10.

In principle, the two beat signals mentioned above can also be additively superimposed and fed to a single common beat analyzer, in which case, however, the beat frequencies of both grids then coincide and the separation and assignment of the grids in the presence of measurement errors is at least made more difficult or, in the extreme case, is no longer possible in an unambiguous way.

Figure 11:
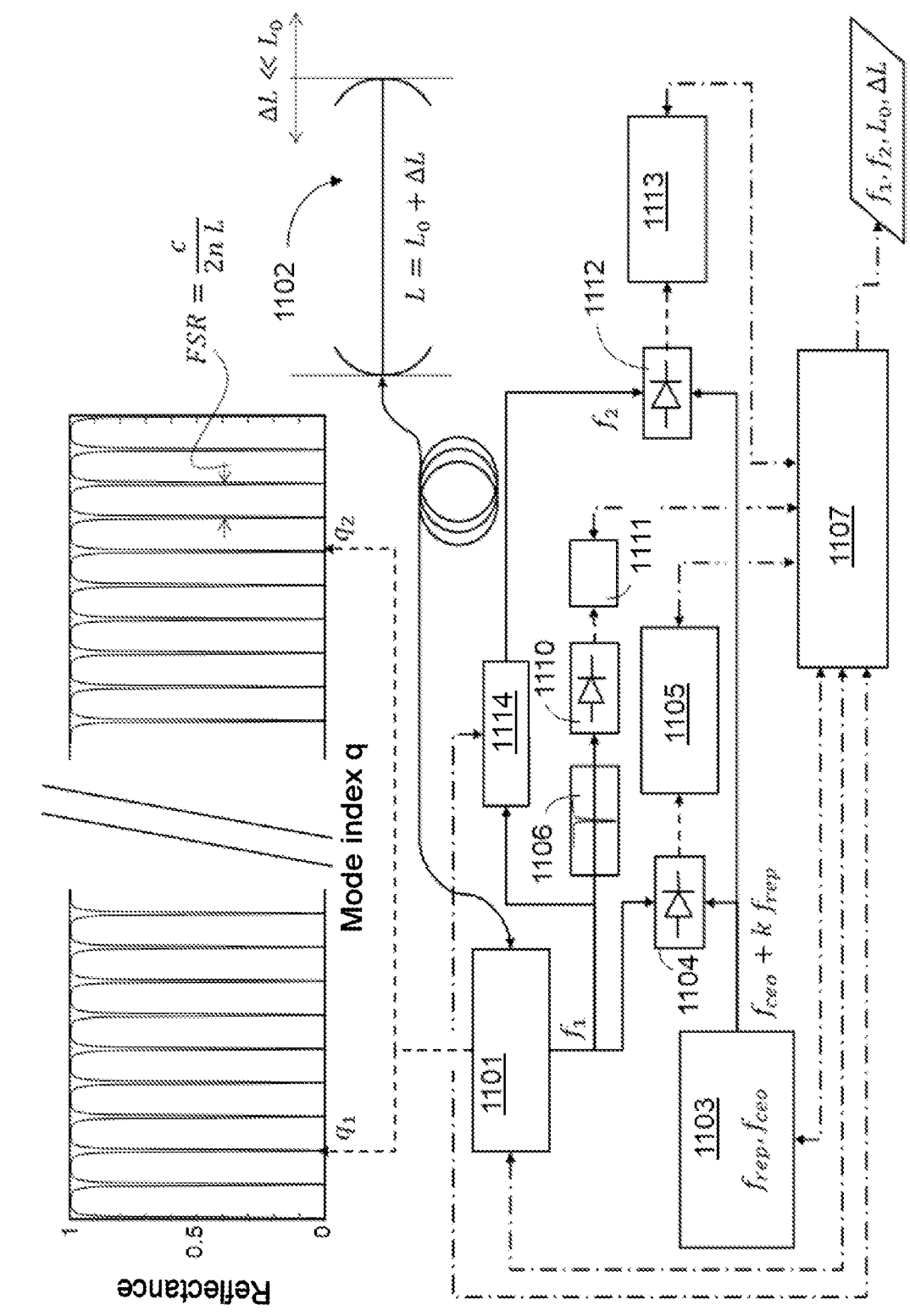
FIG. 11 shows an alternative embodiment to FIG. 10.
Figure 12:
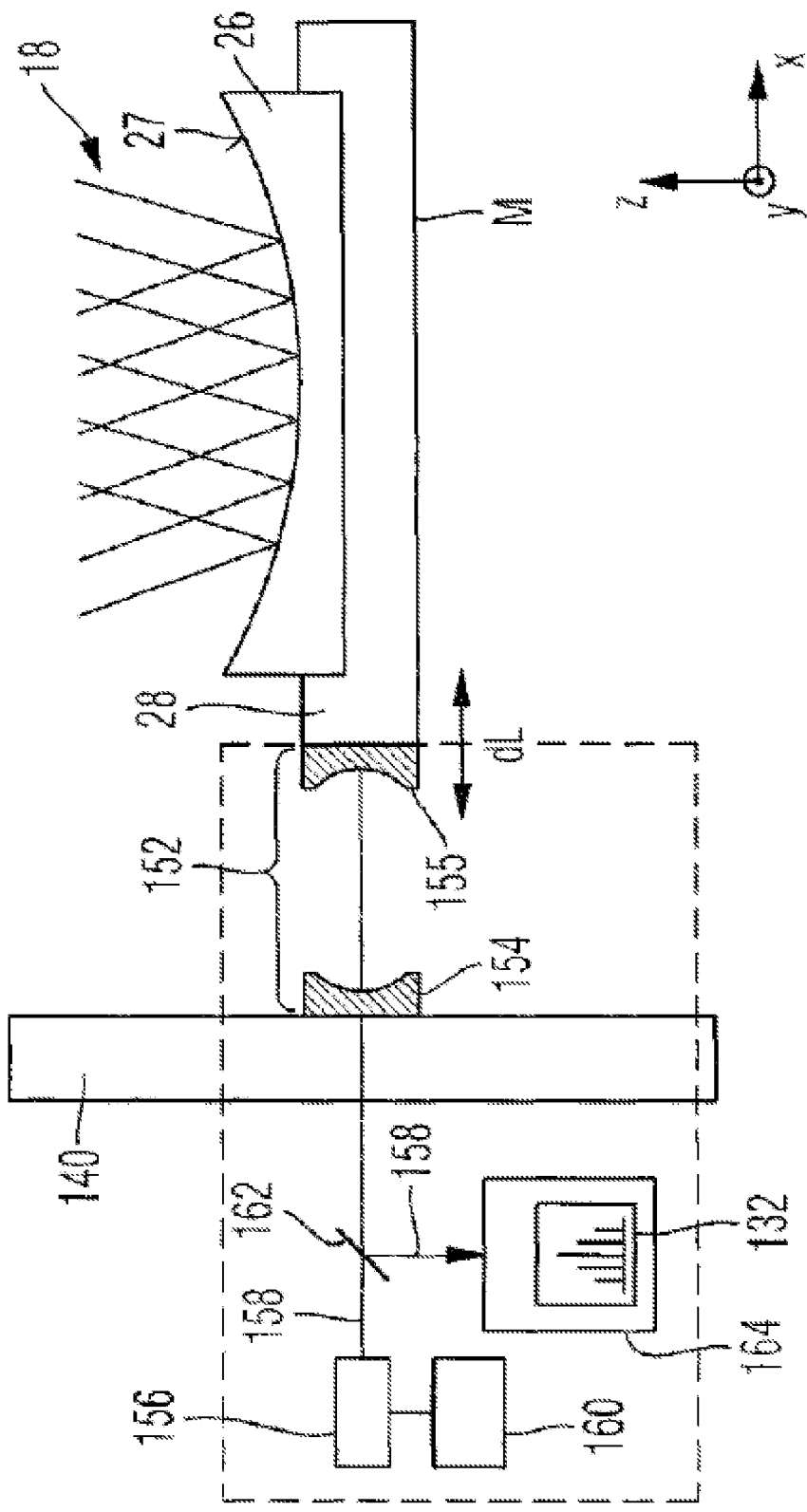
FIG. 12 shows a schematic illustration for explaining a conventional arrangement of a measuring assembly for frequency-based position measurement.

FIG. 11 shows an alternative embodiment to FIG. 10, wherein components analogous or substantially functionally identical to FIG. 10 are designated by reference numerals increased by "100".

In accordance with FIG. 11, with the second tunable laser 1012 from FIG. 10 being dispensed with, a further laser beam for generating a further shifted beat grid is realized by a partial beam being branched off from the tunable laser 1101, which is able to be stabilized to the resonator comb, and being shifted in its frequency by the value $f_{aom}$, by way of an acousto-optical modulator (AOM) 1114. This partial beam having the frequency $f_2=f_1+f_{aom}$, said partial beam being rigidly coupled to the tunable laser 1101 in terms of its frequency, is likewise caused to effect beating with a branched-off beam of the femtosecond laser 1103 on a photodetector 1112. The beat signal obtained in this case is analyzed in terms of its frequency composition via a further beat frequency analyzer unit 1113. Here, too, it is possible, in principle, to feed the two beat signals additively to a single common beat frequency analyzer unit.

Figure 13:
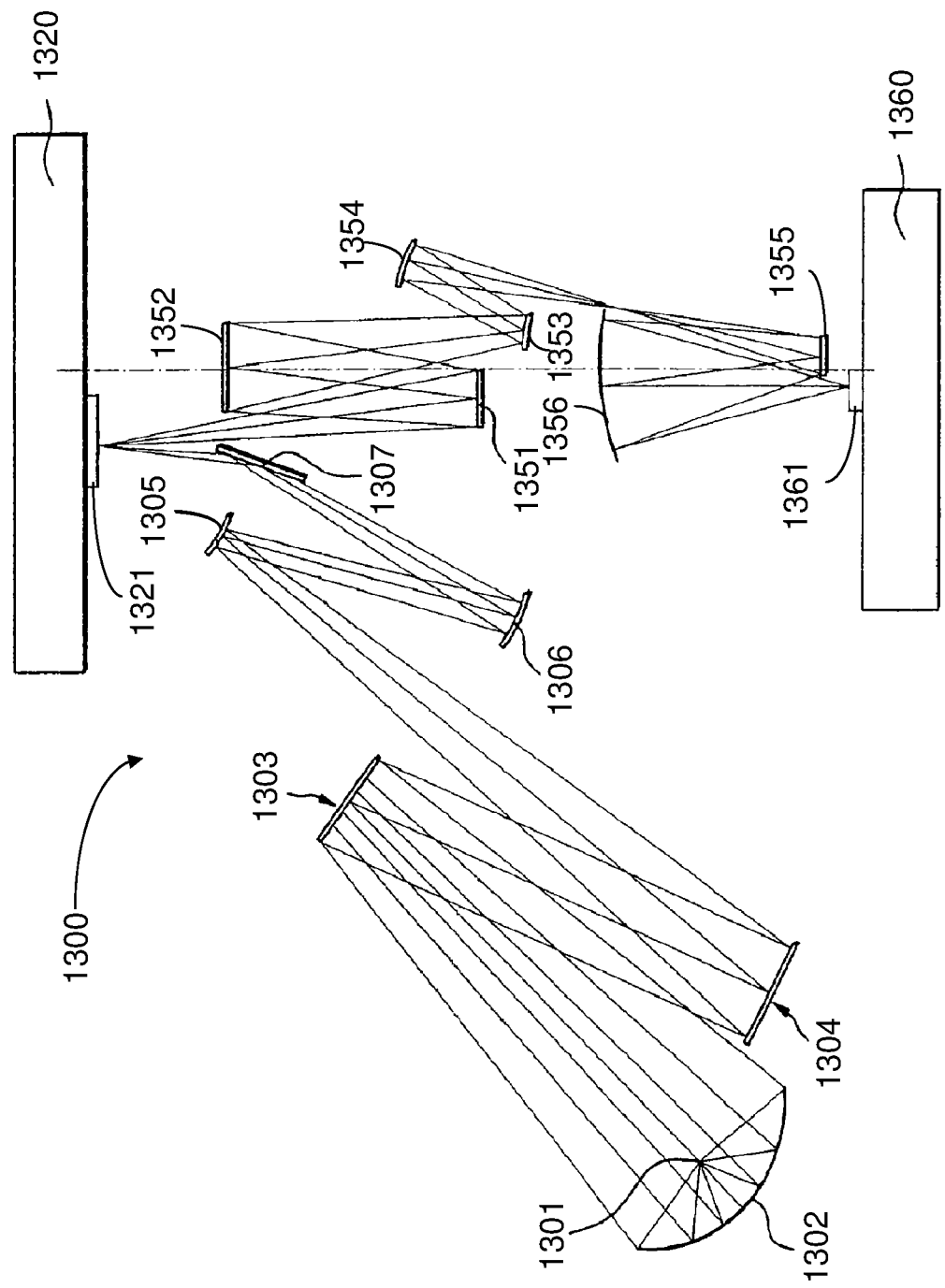
FIG. 13 shows a schematic illustration for explaining the possible arrangement of a microlithographic projection exposure apparatus designed for operation in the EUV.

FIG. 13 shows a schematic illustration of an exemplary microlithographic projection exposure apparatus 1300 designed for operation in the EUV. The measuring assembly according to the invention can be used in this projection exposure apparatus for measuring the distance between the individual mirrors in the projection lens or in the illumination device. However, the invention is not restricted to the application in systems designed for operation in the EUV, but rather is also able to be realized in the measurement of optical systems for other operating wavelengths (e.g. in the VUV range or at wavelengths of less than 250 nm). In further applications, the invention can also be realized in a mask inspection apparatus or a wafer inspection apparatus.

According to FIG. 13, an illumination device of the projection exposure apparatus 1300 comprises a field facet mirror 1303 and a pupil facet mirror 1304. The light from a light source unit comprising a plasma light source 1301 and a collector mirror 1302 is directed onto the field facet mirror 1303. A first telescope mirror 1305 and a second telescope mirror 1306 are arranged in the light path downstream of the pupil facet mirror 1304. A deflection mirror 1307 is arranged downstream in the light path, said deflection mirror directing the radiation that is incident thereon onto an object field in the object plane of a projection lens comprising six mirrors 1351-1356. At the location of the object field, a reflective structure-bearing mask 1321 is arranged on a mask stage 1320, said mask being imaged with the aid of the projection lens into an image plane in which a substrate 1361 coated with a light-sensitive layer (photoresist) is situated on a wafer stage 1360.

Figure 14:
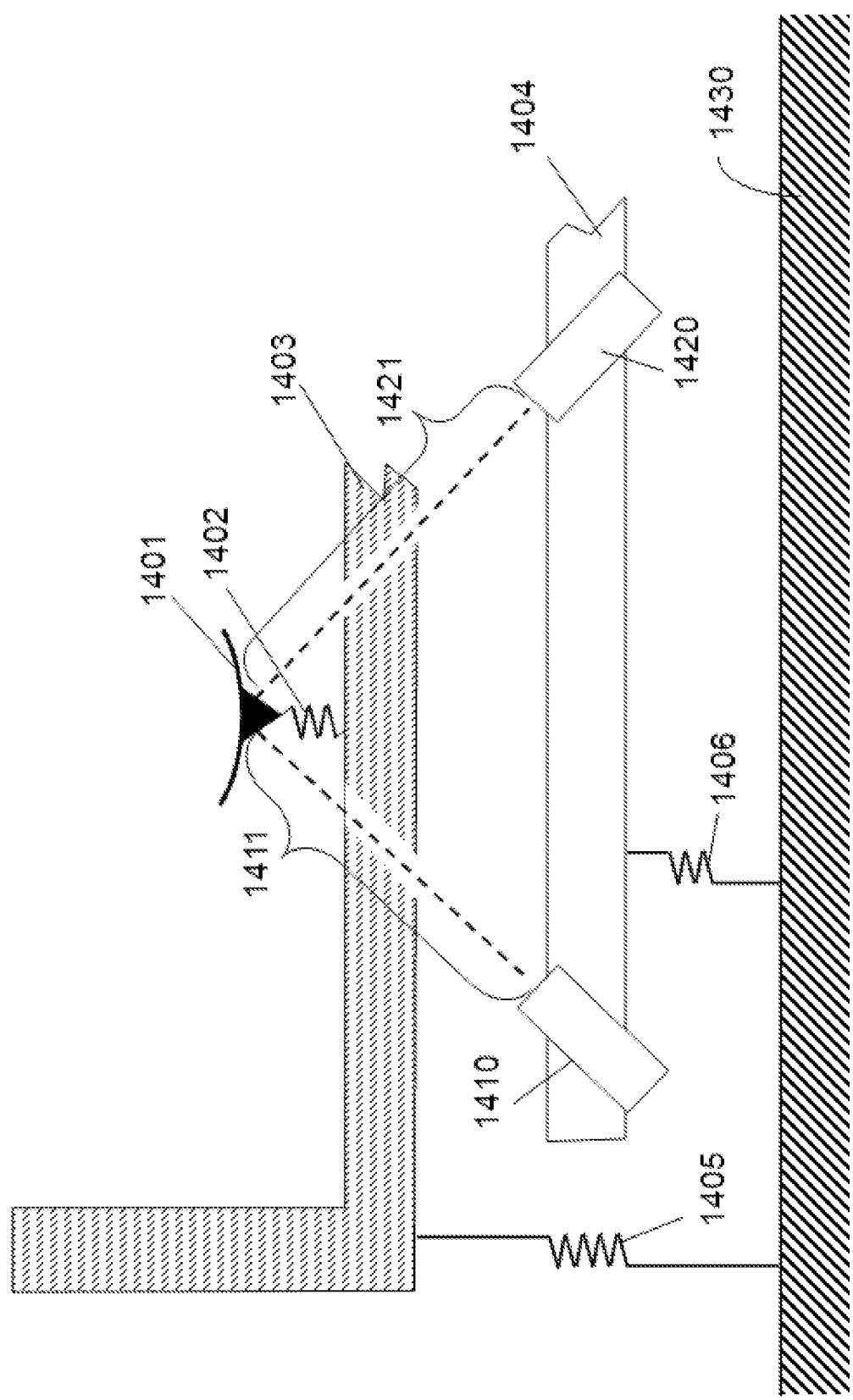
FIG. 14 shows a schematic illustration for explaining a possible realization of measurement paths according to the invention on a mirror in an arrangement with a load-dissipating carrying structure and a measuring structure provided independently thereof.

Without the invention being restricted thereto, e.g. an arrangement known per se, e.g. from U.S. Pat. No. 6,864,988 B2 can be taken as a basis, which includes both a load-dissipating carrying structure 1403 ("force frame") and a measuring structure 1404 ("sensor frame") provided independently thereof. In accordance with FIG. 14, both carrying structure 1403 and measuring structure 1404 are mechanically linked to a baseplate or base 1430 of the optical system independently of one another by way of mechanical links (e.g. springs) 1405 and 1406, respectively, which act as dynamic decoupling. For its part, the mirror 1401 is secured to the carrying structure 1403 by way of a mirror securing device 1402. FIG. 14 schematically depicts two measurement paths 1411 and 1421 extending from the measuring structure 1404 as far as the mirror 1401, which measurement paths are measured with optical resonators according to the invention.

Figure 15:
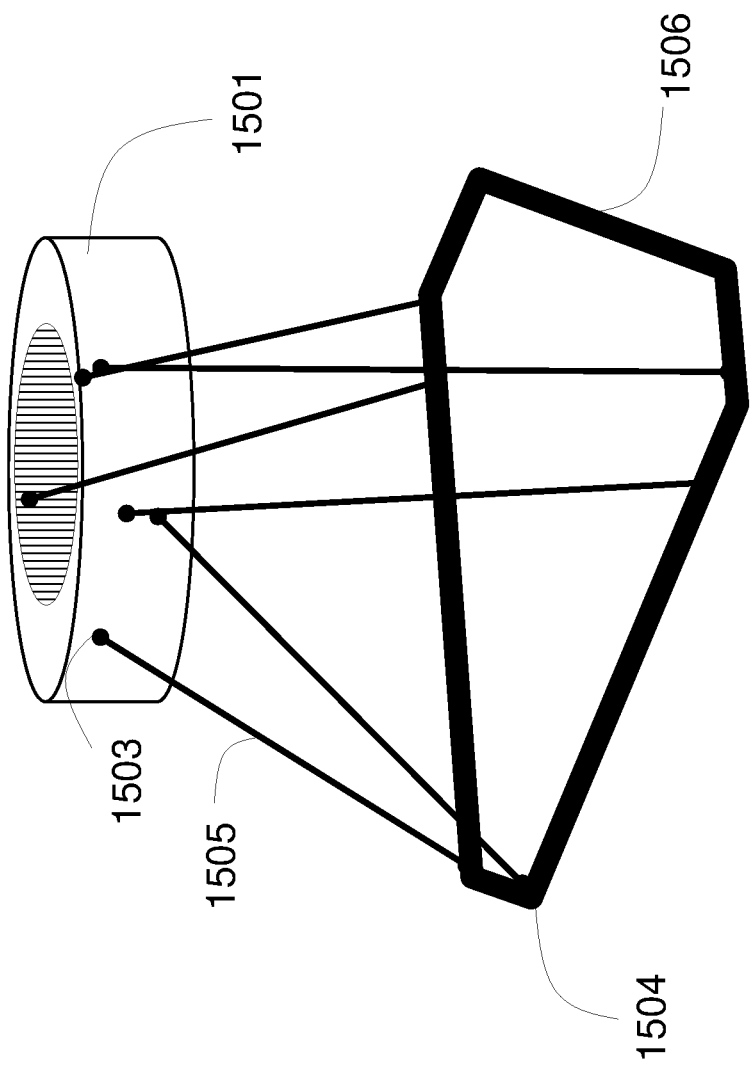
FIG. 15 shows a schematic illustration for explaining a possible determination of the position of a mirror in six degrees of freedom.

In order to measure the location of a mirror in all six degrees of freedom, this requires six optical resonators according to the invention for frequency-based length measurement, one possible configuration being illustrated schematically in FIG. 15. The figure depicts six measurement paths 1505 each having a starting point 1504 situated at a measurement frame 1506 and an end point 1503 situated at a mirror 1501.

Even though the invention has been described on the basis of specific embodiments, numerous variations and alternative embodiments will be apparent to the person skilled in the art, for example through combination and/or exchange of features of individual embodiments. Accordingly, for the person skilled in the art that such variations and alternative embodiments are also encompassed by the present invention, and the scope of the invention is restricted only within the meaning of the appended patent claims and the equivalents thereof.

What is claimed is:

1. A measuring assembly configured for frequency-based determination of a position of a component, comprising:
at least one optical resonator that comprises a stationary first resonator mirror, a movable measurement target assigned to the component, and a stationary second resonator mirror, wherein an optical path through the resonator between the first resonator mirror and the measurement target is offset and parallel to the optical path between the second resonator mirror and the measurement target;
wherein the second resonator mirror consists essentially of an inverting mirror, which reflects a measurement beam from the measurement target back on itself.

2. The measuring assembly as claimed in claim 1, wherein the optical resonator further comprises a retroreflector, which inverts the measurement beam as a parallel-offset beam identically in a direction of the measurement beam.

3. The measuring assembly as claimed in claim 1, wherein the measurement target comprises a retroreflector, which inverts the measurement beam in a parallel-offset beam identically in a direction of the measurement beam.

4. The measuring assembly as claimed in claim 3, wherein the retroreflector is configured to maintain a polarization of the measurement beam.

5. The measuring assembly as claimed in claim 1, wherein the measurement target comprises a plane mirror.

6. The measuring assembly as claimed in claim 1, further comprising a polarization-optical beam splitter.

7. The measuring assembly as claimed in claim 6, wherein a measurement beam from the polarization-optical beam splitter is incident perpendicularly on the measurement target.

8. The measuring assembly as claimed in claim 1, wherein the first resonator mirror has a curvature such that a light field in the resonator is confined stably in the resonator.

9. The measuring assembly as claimed in claim 1, wherein the first resonator mirror is configured as a cat's eye mirror.

10. The measuring assembly as claimed in claim 1, further comprising at least one tunable laser stabilized to a resonator mode of the optical resonator.

11. The measuring assembly as claimed in claim 10, further comprising a control loop configured to stabilize the tunable laser with a Pound-Drever-Hall control loop.

12. The measuring assembly as claimed in claim 10, further comprising at least one femtosecond laser configured to determine a frequency of the laser radiation of the at least one tunable laser.

13. The measuring assembly as claimed in claim 10, further comprising an acousto-optical modulator configured to produce a frequency shift in response to a partial beam branched off from a laser beam generated by the at least one tunable laser.

14. The measuring assembly as claimed in claim 1, further comprising a frequency standard.

15. The measuring assembly as claimed in claim 14, wherein the frequency standard is a gas cell.

16. The measuring assembly as claimed in claim 1, further comprising two tunable lasers, configured to produce an absolute length measurement by being stabilized to different resonator modes with a predetermined frequency spacing of the optical resonator.

17. The measuring assembly as claimed in claim 16, further comprising a respective beat frequency analyzer unit assigned to each of the two tunable lasers.

18. The measuring assembly as claimed in claim 1, further comprising six optical resonators assigned to the component and configured to measure a frequency-based length for determining the position of the component in six degrees of freedom.

19. The measuring assembly as claimed in claim 1, wherein the component is a mirror.

20. An optical system for microlithography, comprising the measuring assembly as claimed in claim 1.

21. The optical system as claimed in claim 20, configured as a microlithographic projection exposure apparatus.

22. A measuring assembly configured for frequency-based determination of a position of a component, comprising:
- at least one optical resonator that comprises a stationary first resonator mirror, a movable measurement target assigned to the component, a stationary second resonator mirror, and an optical group comprising two lens elements in a Kepler arrangement;
- wherein the second resonator mirror consists essentially of an inverting mirror, which reflects a measurement beam from the measurement target back on itself,
- wherein the optical group comprises a mirror having an opening in a common focal plane of said two lens elements, and wherein the mirror of the optical group is configured to reflect the measurement beam back along the beam path returning from the measurement target.

* * * * *

UNITED STATES PATENT AND TRADEMARK OFFICE
CERTIFICATE OF CORRECTION

PATENT NO. : 11,274,914 B2  
APPLICATION NO. : 17/102503  
DATED : March 15, 2022  
INVENTOR(S) : Matthias Manger et al.

Page 1 of 2

It is certified that error appears in the above-identified patent and that said Letters Patent is hereby corrected as shown below:

In the Specification

In Column 7, Line 28, delete "$M_1$," and insert -- $\underline{M_1}$, --.

In Column 7, Lines 60-65, delete "$M_{RR}(s_x, s_y) = \begin{pmatrix} -1 & 0 & 0 & 0 & -2s_x \\ 0 & -1 & 0 & 0 & 0 \\ 0 & 0 & -1 & 0 & -2s_y \\ 0 & 0 & 0 & -1 & 0 \\ 0 & 0 & 0 & 0 & -1 \end{pmatrix}$ (5)" and insert -- $\underline{M}_{RR}(s_x, s_y) = \begin{pmatrix} -1 & 0 & 0 & 0 & -2s_x \\ 0 & -1 & 0 & 0 & 0 \\ 0 & 0 & -1 & 0 & -2s_y \\ 0 & 0 & 0 & -1 & 0 \\ 0 & 0 & 0 & 0 & 1 \end{pmatrix}$ (5) --.

In Column 8, Line 38, delete "$M\vec{V} = \text{diag}(\mu)\vec{V}$ (9)," and insert -- $\underline{M}\,\underline{V} = \text{diag}(\underline{\mu})\underline{V}$ (9) --.

In Column 8, Line 39, delete "($V_1\ V_2\ V_3\ V_4\ V_5$)" and insert -- $(\underline{V_1}\ \underline{V_2}\ \underline{V_3}\ \underline{V_4}\ \underline{V_5})$ --.

In Column 9, Line 30, delete "++" and insert -- + --.

In Column 19, Line 3, delete "$f_{aom}$," and insert -- $f_{aom}$ --.

Signed and Sealed this  
Eleventh Day of April, 2023

Katherine Kelly Vidal  
*Director of the United States Patent and Trademark Office*

In the Claims

In Column 21, Line 11, in Claim 17, after "analyzer" delete "unit".

In Column 21, Line 13, in Claim 18, after "1," delete "further".